(12) United States Patent
Neudeck

(10) Patent No.: US 12,402,369 B1
(45) Date of Patent: Aug. 26, 2025

(54) MITIGATING DETRIMENTAL MOBILE ION CONTAMINATION EFFECTS IN INTEGRATED CIRCUITS

(71) Applicant: United States of America as represented by the Administrator of NASA, Washington, DC (US)

(72) Inventor: Philip G. Neudeck, Cleveland, OH (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 526 days.

(21) Appl. No.: 17/930,780

(22) Filed: Sep. 9, 2022

Related U.S. Application Data

(60) Provisional application No. 63/273,416, filed on Oct. 29, 2021.

(51) Int. Cl.
 *H10D 62/10* (2025.01)
(52) U.S. Cl.
 CPC ................... *H10D 62/112* (2025.01)

(58) Field of Classification Search
 CPC .................................................. H10D 62/112
 See application file for complete search history.

(56) References Cited

U.S. PATENT DOCUMENTS

| | | | | |
|---|---|---|---|---|
| 5,016,081 A | * | 5/1991 | Brown | H01L 23/26 |
| | | | | 257/E23.137 |
| 5,306,945 A | * | 4/1994 | Drummond | H01L 23/585 |
| | | | | 257/306 |
| 6,051,474 A | * | 4/2000 | Beasom | H01L 21/763 |
| | | | | 438/430 |

* cited by examiner

*Primary Examiner* — Syed I Gheyas
(74) *Attorney, Agent, or Firm* — Robert H. Earp, III; Mark Wolfgang; Trenton J. Roche

(57) ABSTRACT

Mitigation of detrimental mobile ion contamination effects in integrated circuits (ICs) using a metal with a negative voltage bias or connected to a negative voltage source supply (−VSS) is disclosed. Such architectures mitigate mobile ion contamination by selecting/imposing advantageous layout geometries/rules within upon the device structure, bias voltages, and/or multi-level interconnects present in the IC design. More specifically, safe routing of a positive voltage in a metal trace crossing/spanning multiple resistors or transistors is provided.

20 Claims, 25 Drawing Sheets

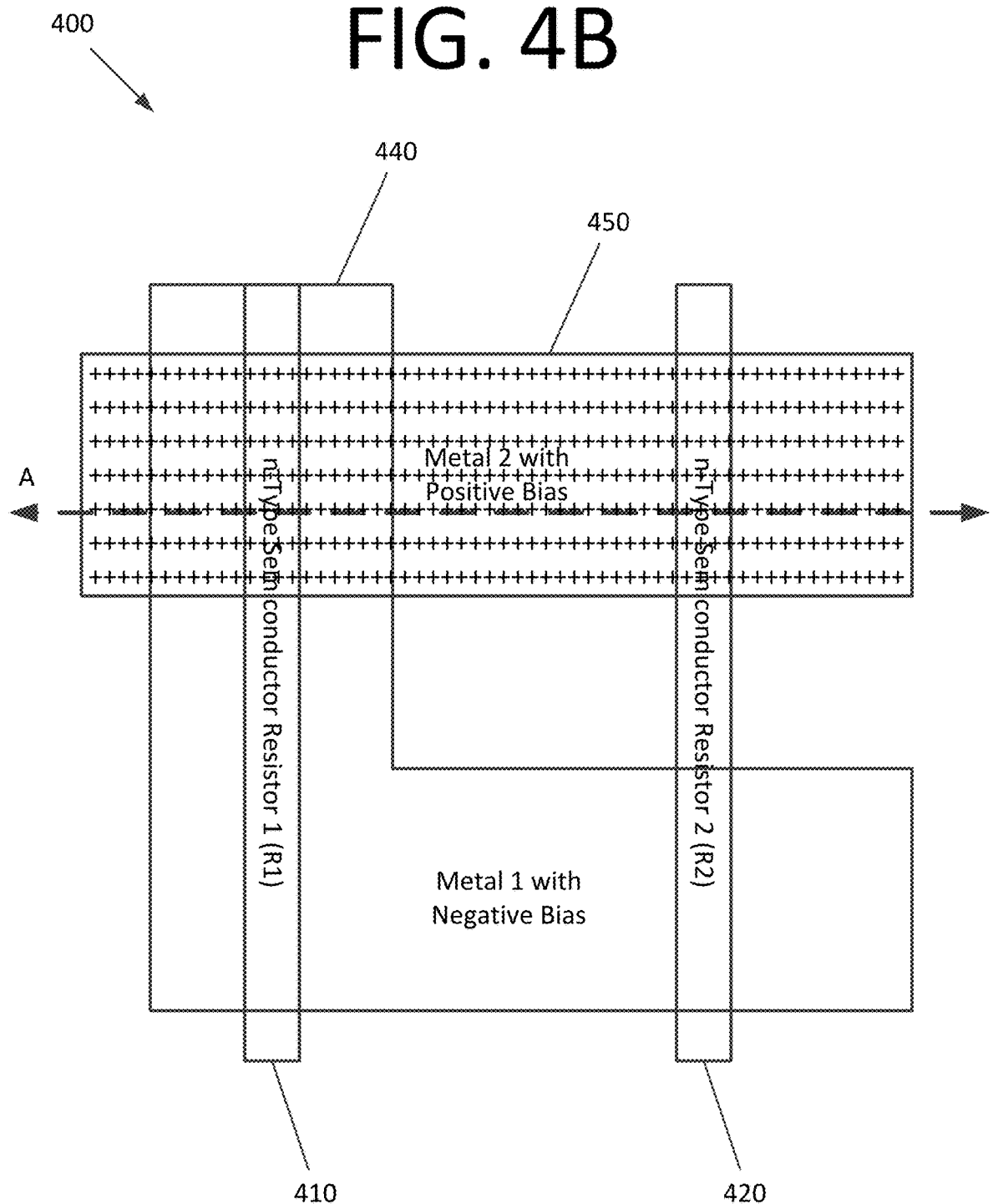

MITIGATING DETRIMENTAL MOBILE ION CONTAMINATION EFFECTS IN INTEGRATED CIRCUITS

CROSS-REFERENCE TO RELATED APPLICATION

This application claims the benefit of U.S. Provisional Patent Application No. 63/273,416 filed Oct. 29, 2021. The subject matter of this earlier filed application is hereby incorporated by reference in its entirety.

ORIGIN OF THE INVENTION

The invention described herein was made by employees of the United States Government and may be manufactured and used by or for the Government for Government purposes without the payment of any royalties thereon or therefor.

FIELD

The present invention generally pertains to mitigation of contaminants in integrated circuits (ICs), and more particularly, to mitigation of detrimental mobile ion contamination effects in ICs using a metal with a negative voltage bias or connected to a negative voltage source supply.

BACKGROUND

Semiconductor IC electronics that can operate in harsh environments, such as those with high temperatures, offer important benefits to the performance capabilities in aerospace, automotive, well-drilling, and other systems and fields. A requirement for IC deployment into these application-desired harsh environments requires that an IC functions with excellent stability for long durations without need for replacement or maintenance-preferably for the entire lifetime of the system. Achieving such durability in IC electronics is particularly challenging in environments that combine high temperature (e.g., 400° C. or more) and ionic contaminants (e.g., sodium and potassium ions) that are prevalent in some desired applications and known to cause instability of semiconductor device electrical functionality. The general phenomenon of ionic contamination instability and mitigation techniques applicable for successful operation of conventional temperature silicon Metal-Oxide-Semiconductor Field Effect Transistors (MOSFETs) is a known problem.

Alkali metals, such as sodium and potassium in $SiO_2$ often exist as small positive ions. In this state, they readily move through thermal oxide under the influence of electric fields, even at room temperature. However, this effect becomes more prevalent at higher temperatures. Such motion within the gate oxides of MOSFETs causes changes in the threshold voltage and severely impacts reliability.

Integrated circuit manufacturers typically use three approaches to solve this problem: (1) eliminating as many sources of mobile ions (such as sodium and potassium) as possible during manufacturing; (2) using gettering to segregate and immobilize sodium and potassium mobile ions in phosphorus-doped oxides; and (3) using diffusion barrier layers, such as silicon nitride, as an encapsulant to limit penetration of ambient mobile ion contamination (e.g., sodium and potassium).

The combination of these three approaches has virtually eliminated practical reliability problems with sodium contamination and that from other mobile ions, as evidenced by the virtual absence of literature on the subject since the early 1980s. However, recent data shows that modern ICs still contain significant amounts of process-induced sodium contamination within the borophosphosilicate glass (BPSG) layers. Also, per the above, the problem becomes more acute at higher temperatures. Cleanliness alone is unlikely to be a sufficient guarantee of reliable IC operation at higher temperatures and in dirtier environments with relatively higher concentrations of mobile ion contamination.

In order to better understand the problem, it is useful to review the underlying material/device physics as it manifests itself in semiconductor IC devices in general, and particularly, in SiC Junction Field Effect Transistor (JFET)-R ICs. FIGS. 1A and 1B show a side cross-section view and a top view, respectively, of a simplified depiction of a small section of a SiC JFET-R IC 100 that is microscopically defined by known semiconductor fabrication processing. Subsections of two separate semiconductor mesa resistors R1 110 and R2 120 with n-type conduction have been fabricated to reside on a semiconductor substrate 130 of p-type conduction and are insulated from each other. Respective semiconductor p-n junctions are formed at the border between p-type substrate 130 and n-type resistors 110, 120 to provide sufficient electrical insulation of R1 110 and R2 120. Dielectric insulation layers 160, 170 also provide for sufficient electrical insulation of R1 110 and R2 120 from the overlying interconnect metal layers 140, 150. Electrical isolation of distinct electronic signals in R1 110 and R2 120 is desired for IC 100 to perform its intended circuit function. For clarity of illustration, the cross-sectional vertical scale has been exaggerated compared to the horizontal/lateral scale, as is the case with the other IC cross-sectional figures herein.

FIGS. 1C and 1D show the side cross-section view and top view of SiC JFET-R IC 100 from FIGS. 1A and 1B, respectively, but with the addition of positive mobile ion contaminants, depicted by "+" signs. The positive mobile ion contaminants have been introduced into dielectric layers 160, 170, as is likely to occur simply by exposing IC 100 to environments with sodium, potassium, calcium, and/or other ionic elements and compounds with positive charge that move through dielectric materials at high temperature. While chip passivation techniques and packaging help to prevent mobile ion contamination from occurring at conventional temperatures (e.g., room temperature), such contamination of dielectric layers 160, 170 is far more likely to occur if IC 100 operates in harsher and less-controlled high-temperature and/or dirtier environmental conditions, such as in jet engines, on the surface of Venus, in deep well drilling instrumentation, etc. For simplicity of illustration, FIGS. 1C and 1D depict a relatively uniform concentration of ions spread throughout dielectric layers 160, 170, and it is implied that no electrical bias has yet been applied to IC 100.

FIGS. 1E-J show behaviors of ion contaminants physically moving and rearranging themselves in response to application of both high temperature and applied electrical bias voltage for a sufficient time duration. A negative voltage bias is applied to metal layers 140, 150 in FIGS. 1E-G and a positive voltage bias is applied to metal layers 140, 150 in FIGS. 1H-J. Such bias voltages are present during normal electrical operation of IC 100 when performing its intended function.

FIGS. 1E-G simplistically depict the rearrangement of positive ions that occurs when metal layers 140, 150 have negative bias voltages applied at temperatures sufficiently high to enable ion migration through the dielectric. Driven by coulombic attraction force, the positively charged mobile ion contaminants migrate towards negatively biased traces of metal layers 140, 150 as shown. Such rearrangement does not harm the electrical isolation of signals running through resistors R1 110 and R2 120.

FIGS. 1H-J simplistically depict the rearrangement that occurs when metal layers 140, 150 have positive bias voltages applied. In contrast to the negative bias voltage of FIGS. 1E-G, the positive voltage (given sufficient time at high temperature) repels the mobile ions down towards the interface between dielectric layer 160 and semiconductor 130. As is known for MOS devices, the presence of sufficiently high positive ion density in sufficiently close proximity to the semiconductor/dielectric interface can result in formation of a parasitic MOS inversion conduction layer of electrons 180 just on the semiconductor side of the interface. Inversion conduction layer 180 forms an undesired electrical connection between R1 110 and R2 120 that interferes with operation of IC 100. Note that inversion conduction layer 180 only forms beneath traces of positively biased metal layers 140, 150.

Various other component combinations are possible in existing ICs, such as a transistor and a resistor, two transistors, etc. However, these ICs still experience the positive ion contamination issues discussed above. FIGS. 2A and 2B show a side cross-section view and a top view, respectively, of a simplified depiction of a small section of a SiC JFET IC 200. As with IC 100 of FIGS. 1A-J, IC 200 includes a resistor R2 220 with an n-mesa channel, p-type semiconductor epilayers and substrate 230, metal layers 240, 250 with a positive voltage applied, dielectric layers 260, 270, and an inversion conduction layer 280. However, instead of resistor R1 100, IC 200 includes a JFET1 210 with a p-mesa gate 212 and an n-mesa channel 214. Positive ion contamination in dielectric layers 260, 270 has migrated away from positive voltage metal trace 240 during biased operation of IC 200 at high temperature that causes parasitic MOS inversion conduction layers 280 to form and undesirably electrically connect the n-mesa 214 of JFET1 210 to the n-mesa of R2 220.

In practice, many ICs, including NASA Glenn Research Center (GRC) extreme environment SiC JFET ICs, function using both positive and negative voltages. Indeed, positive voltages need to be safely routed in interconnect metals throughout an extreme environment IC. Given the higher contamination and higher temperatures inherent to much harsher environments that NASA is intending to develop and operate ICs in such as aircraft engines, space motors, subterranean drills (potentially on other planets or moons), Venus or Mercury probes and explorers, etc., existing techniques used to successfully mitigate mobile ion transistor instability in silicon at conventional operating temperatures typically less than 125° C. are far less likely to succeed in sufficiently stabilizing operation of silicon carbide ICs operating at 400° C. or more. Indeed, NASA GRC has based its extreme temperature IC technology on the Junction Field Effect Transistor (JFET) device with a p-n junction-based gate that is inherently more stable in extreme environments than is the MOSFET device, the gate oxide of which cannot withstand extreme conditions with sufficient electronic stability behavior. Similarly, NASA GRC has replaced the silicon semiconductor with an inherently more robust SiC semiconductor, among other technical steps taken to achieve extreme temperature durable IC technology.

NASA has presented the adverse circuit impact of mobile ions observed in earlier generations of prototype extreme temperature ICs that were based upon SiC JFETs and resistors. NASA suggested that the combination of high temperature and bias migrated sodium ions residing in the interconnect dielectric under positive voltage-biased metal interconnect traces formed parasitic SiC MOSFET inversion channels that adversely conducted current between physically separated SiC mesa resistors that were not expected to have such significant conduction therebetween. This parasitic MOSFET inversion channel rendered the intended SiC JFET IC differential amplifier circuit that functioned at room temperature non-functional when the temperature was significantly increased.

In the years since this research, NASA has taken steps to somewhat mitigate mobile ion effects in SiC JFET IC designs, including addition of a "field stop" p-type implant to the SiC JFET IC process flow in order to somewhat inhibit parasitic inversion channel formation causing parasitic conduction during extreme environment operation of these ICs. However, as these ICs become subjected to harsher environments for longer operating times, it remains far from certain whether the existing mobile ion mitigation strategies will prove sufficient. Accordingly, improved and/or alternative approach to alleviating mobile ion contamination effects may be beneficial.

SUMMARY

Certain embodiments of the present invention may be implemented and provide solutions to the problems and needs in the art that have not yet been fully solved by conventional mobile ion contamination mitigation technologies or provide a useful alternative thereto. For example, some embodiments of the present invention pertain to mitigation of detrimental mobile ion contamination effects in ICs using a metal with a negative voltage bias or connected to a negative voltage source supply.

In an embodiment, an integrated circuit includes a pair of laterally separated semiconductor components with lateral extent dimensions including at least one semiconductor region of n-type conductivity polarity located in physical contact with a p-type top semiconductor surface layer of a substrate. The integrated circuit also includes a first dielectric layer located on top of the p-type top semiconductor surface layer. The first dielectric layer is configured to provide electrical insulation from subsequent layers of the semiconductor integrated circuit located above the first dielectric layer. The integrated circuit further includes a first metal layer located on top of at least a portion of the first dielectric layer. The first metal layer is configured to have a negative voltage bias and at least some lateral extent dimensions overlapping and exceeding lateral extent dimensions of at least one of the pair of laterally separated semiconductor devices. The first metal layer is positioned to break a parasitic conduction circuit formed by positive ion contamination between the pair of laterally separated semiconductor components.

In another embodiment, a semiconductor integrated circuit includes a substrate including a top semiconductor surface layer of p-type conductivity polarity and a pair of laterally separated semiconductor components with lateral extent dimensions including at least one semiconductor region of n-type conductivity polarity located in physical contact with the p-type top semiconductor surface layer of the substrate. The semiconductor integrated circuit also includes a first dielectric layer located on top of the p-type top semiconductor surface layer. The first dielectric layer is configured to provide electrical insulation from subsequent layers of the semiconductor integrated circuit located above the first dielectric layer. The semiconductor integrated circuit further includes a first metal layer located on top of at least a portion of the first dielectric layer. The first metal layer is configured to have a negative voltage bias and at least some lateral extent dimensions overlapping and exceeding lateral extent dimensions of at least one of the pair of laterally separated semiconductor devices. Additionally, the semiconductor integrated circuit includes a second dielectric layer located on top of the first dielectric layer and the first metal layer. The second dielectric layer provides electrical insulation from subsequent layers of the semiconductor integrated circuit located above the second dielectric layer. The semiconductor integrated circuit also includes a second metal layer located on top of at least a portion of the second dielectric layer. The second metal layer is configured to have a positive voltage bias and at least some lateral extent dimensions overlapping and bridging the lateral extent dimensions of the pair of laterally separated semiconductor electronic devices.

In yet another embodiment, a multilayer integrated circuit includes a first insulated semiconductor component and a second insulated semiconductor component having lateral extent dimensions including at least one semiconductor region of n-type conductivity polarity. The multilayer integrated circuit also includes a first metal layer configured to have a negative voltage bias and at least some lateral extent dimensions overlapping and exceeding lateral extent dimensions of the first insulated semiconductor component, the second insulated semiconductor component, or both. The first insulated semiconductor component and the second insulated semiconductor component are laterally separated from one another. The first metal layer is located above the first insulated semiconductor component and the second insulated semiconductor component, but not physically connected to the first insulated semiconductor component and the second insulated semiconductor component. The first metal layer is also positioned to break a parasitic conduction circuit formed by positive ion contamination between the first insulated semiconductor component and the second insulated semiconductor component.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 4B is a top view illustrating the pair of laterally separated semiconductor electronic devices of FIG. 4A with the dielectric layers and p-type semiconductor omitted for clarity, according to an embodiment of the present invention.

Unless otherwise indicated, similar reference characters denote corresponding features consistently throughout the attached drawings.

DETAILED DESCRIPTION OF THE EMBODIMENTS

Some embodiments of the present invention pertain to mitigation of detrimental mobile ion contamination effects in ICs using a metal with a negative voltage bias or connected to a negative voltage source supply (−VSS). Such embodiments mitigate mobile ion contamination (e.g., positively charged sodium ions, potassium ions, calcium ions, etc.) by selecting/imposing advantageous layout geometries/rules on the device structure, bias voltages, and/or multilevel interconnects present in the IC design, such as the NASA Glenn SiC JFET-R extreme temperature durable IC design and fabrication technology. More specifically, some embodiments provide safe routing of a positive voltage in a metal trace crossing/spanning multiple resistors or transistors. Such embodiments may provide effective mitigation of mobile ion contamination with little or no increase in chip cost. It should be noted that embodiments and their principles are not limited to ICs using resistors alone, but can also be applied to architectures using transistors, other semiconductor devices, or two or more different types of semiconductor devices used in the same IC. Such semiconductor devices are referred to herein as "components."

Per the above, most semiconductor technologies are intended for room temperature and benign environment operation and have well-established passivation, handling, and packaging strategies that largely prevent/preclude mobile ion contamination from entering key dielectric layers of the IC and resulting device electrical instabilities. However, these strategies do not always succeed in harsh, high temperature operating environments. This is due, in part, to the fact that diffusivity of the mobile ions increases with temperature. The mitigation techniques of some embodiments, however, enable high temperature IC operation even where other mobile ion mitigation strategies have failed.

Figure 1A:
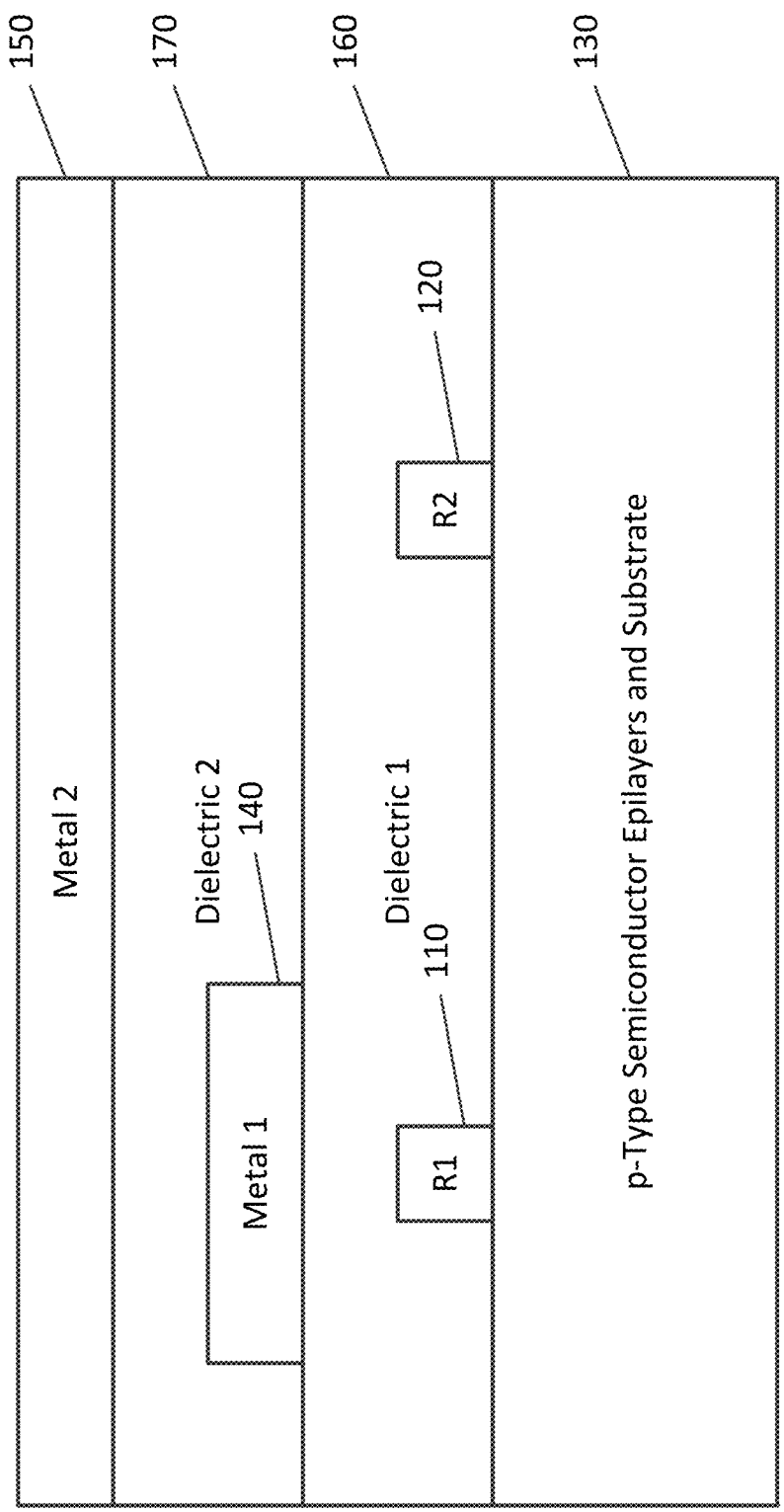
FIG. 1A is a side cross-section view illustrating a pair of laterally separated semiconductor electronic devices (resistors of mesa-etched construction) commonly implemented in a SiC JFET-R IC.
Figure 1B:
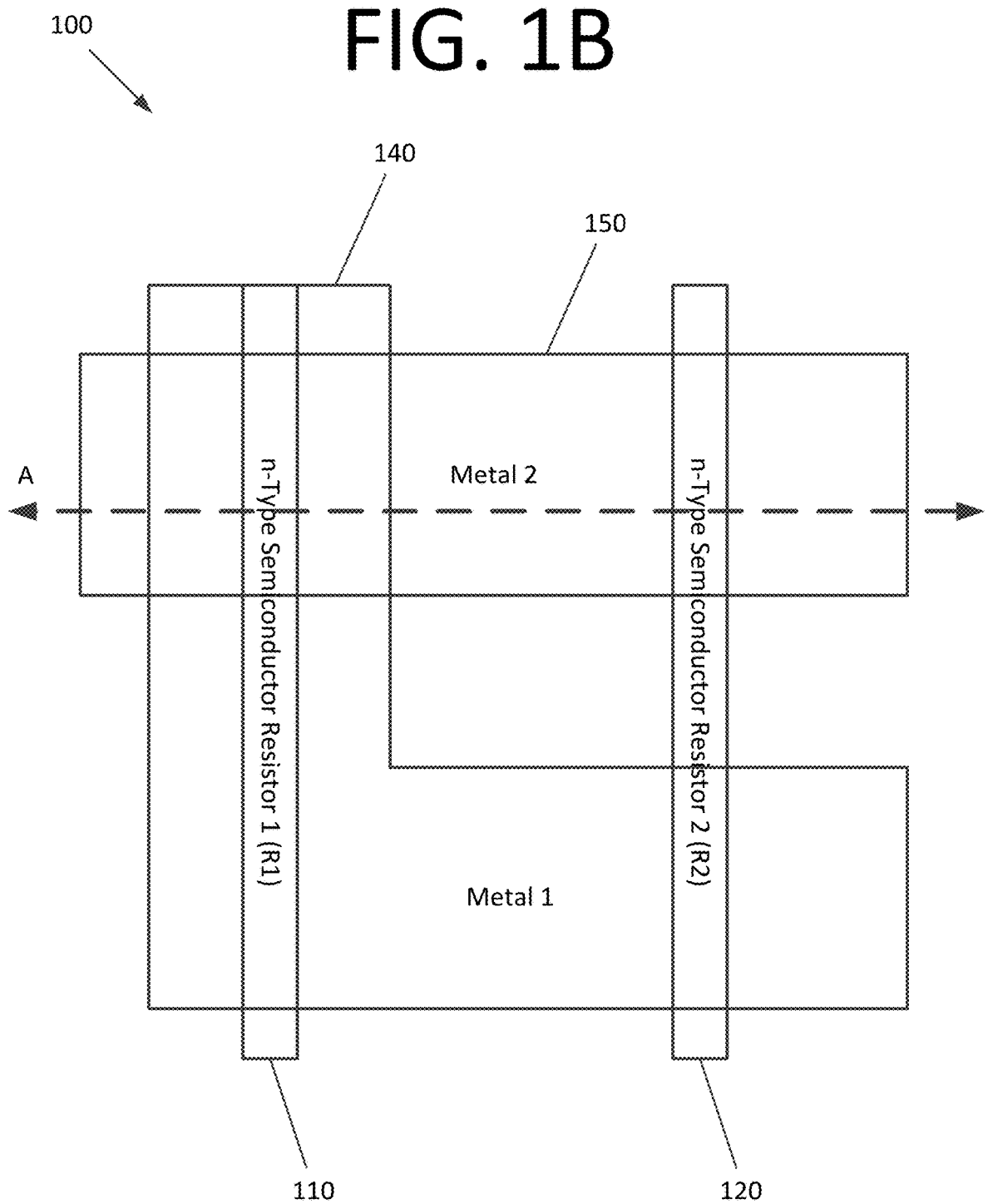
FIG. 1B is a top view illustrating the pair of laterally separated semiconductor electronic devices of FIG. 1A with the dielectric layers and p-type semiconductor omitted for clarity.
Figure 1C:
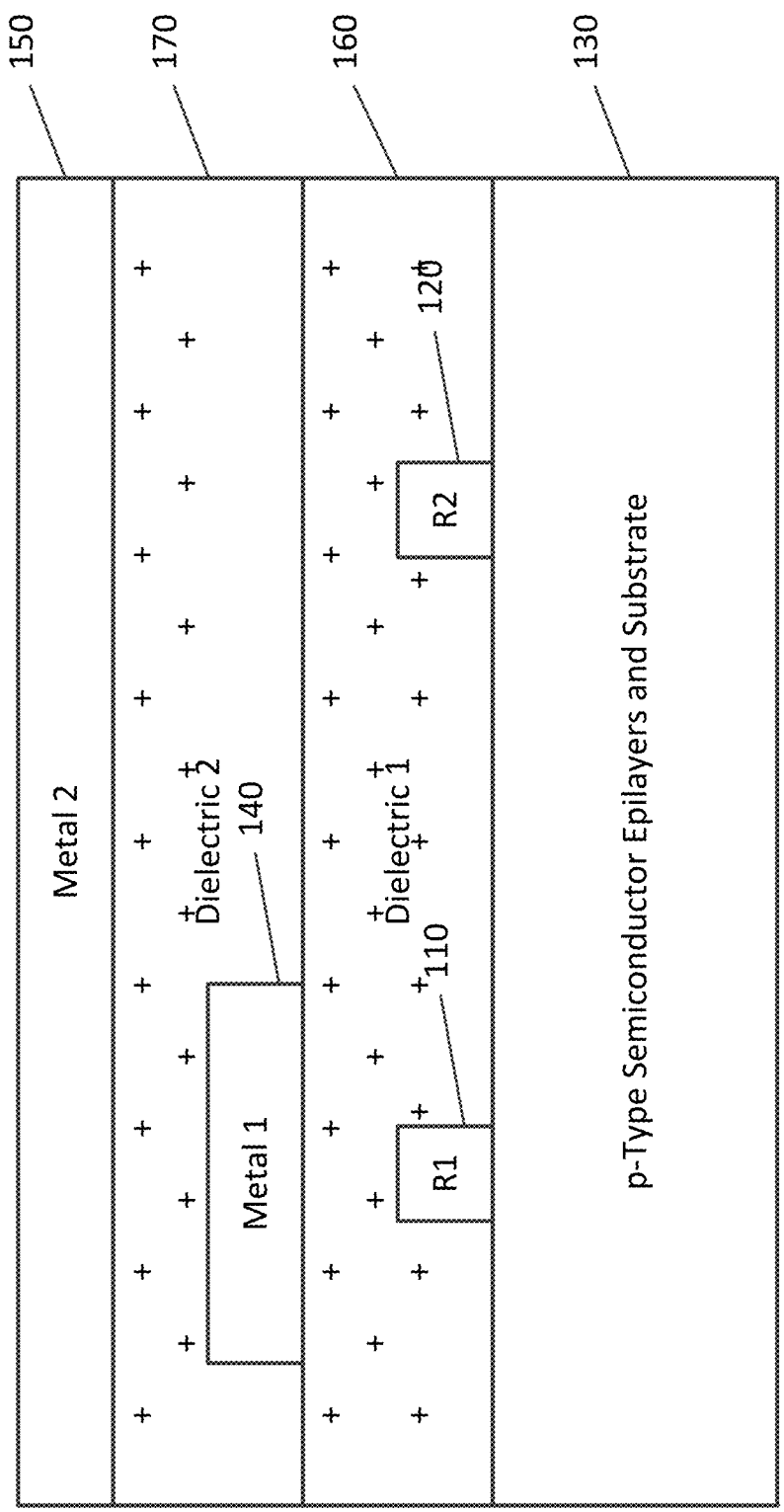
FIGS. 1C and 1D show the side cross-section view and top view of the pair of laterally separated semiconductor electronic devices from FIGS. 1A and 1B, respectively, but with the addition of positive mobile ion contaminants.
Figure 1D:
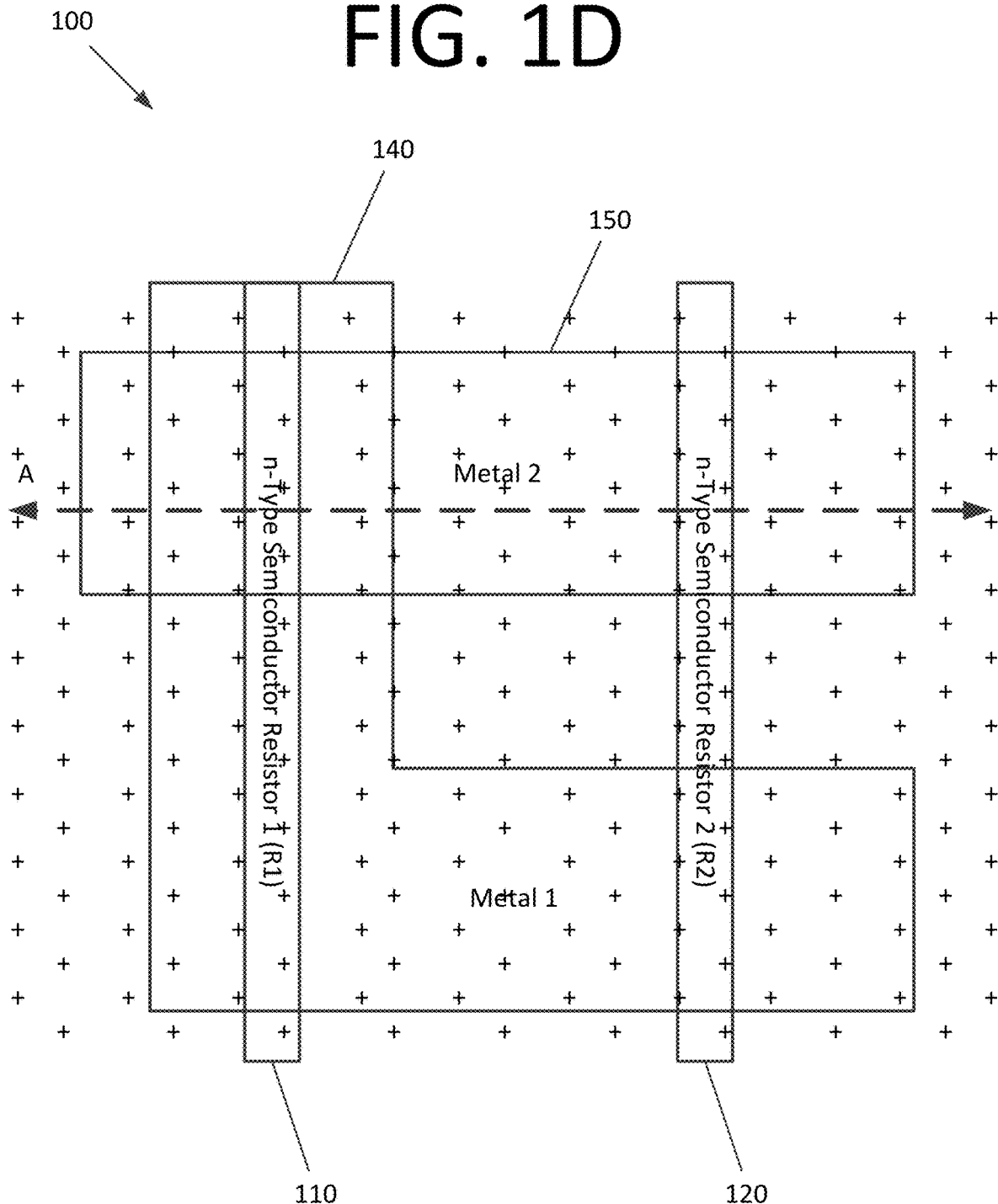
Figure 1E:
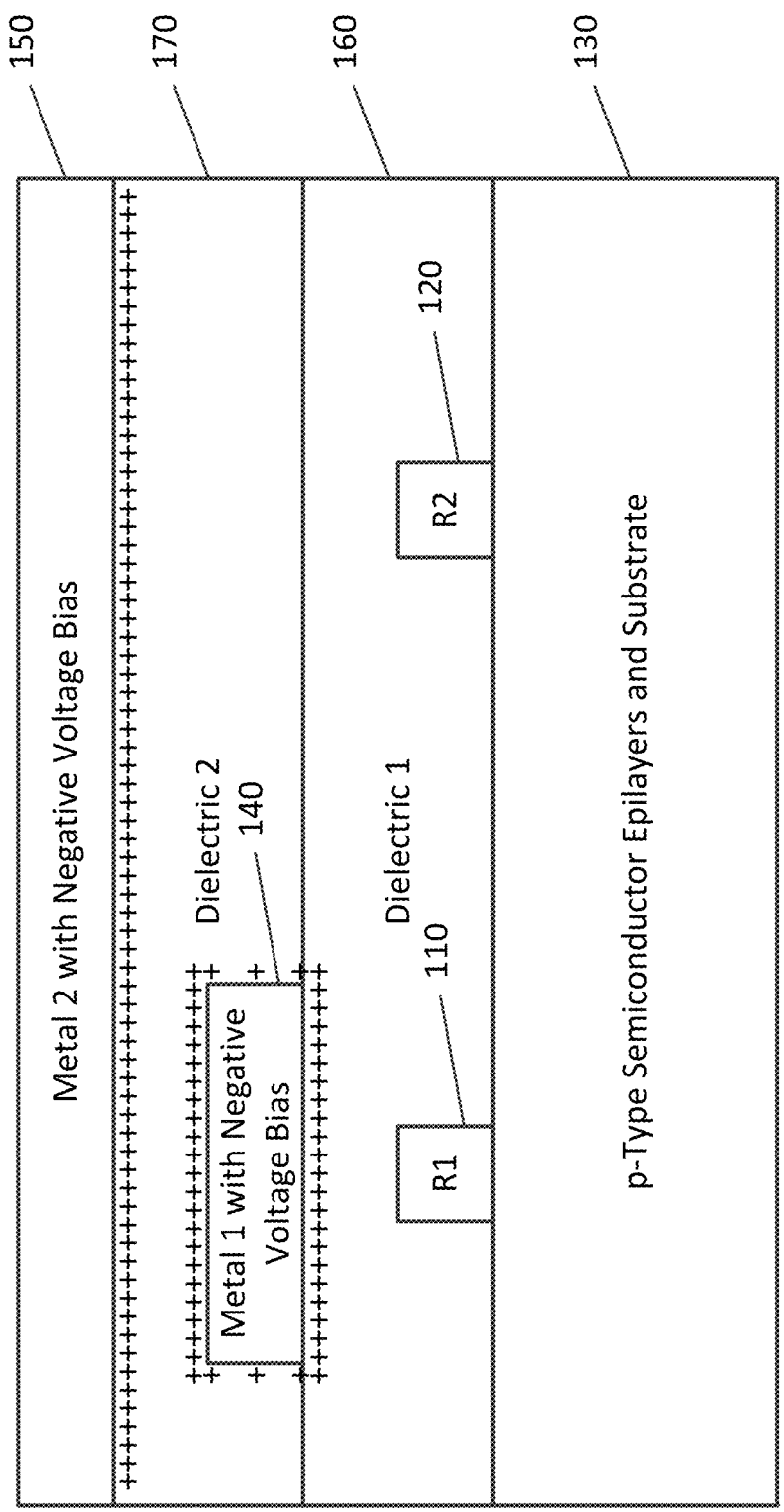
FIGS. 1E-G show two side cross-section views and a top view of the pair of laterally separated semiconductor electronic devices with positive mobile ion contaminants from FIGS. 1C and 1D, respectively, but with a negative voltage bias applied to metals 1 and 2 after sufficient time duration and higher temperature such that the mobile positive ions have moved towards the negatively biased metals.
Figure 1F:
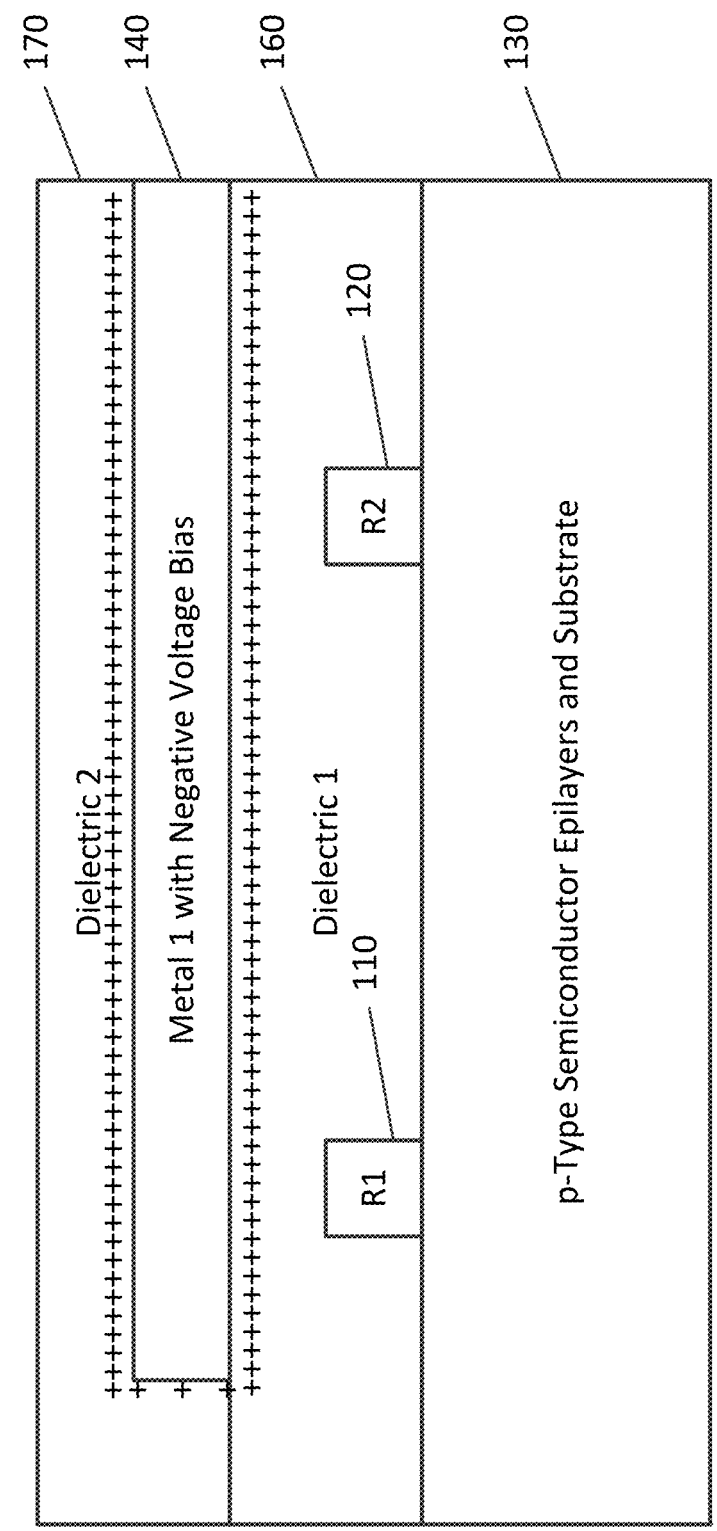
Figure 1G:
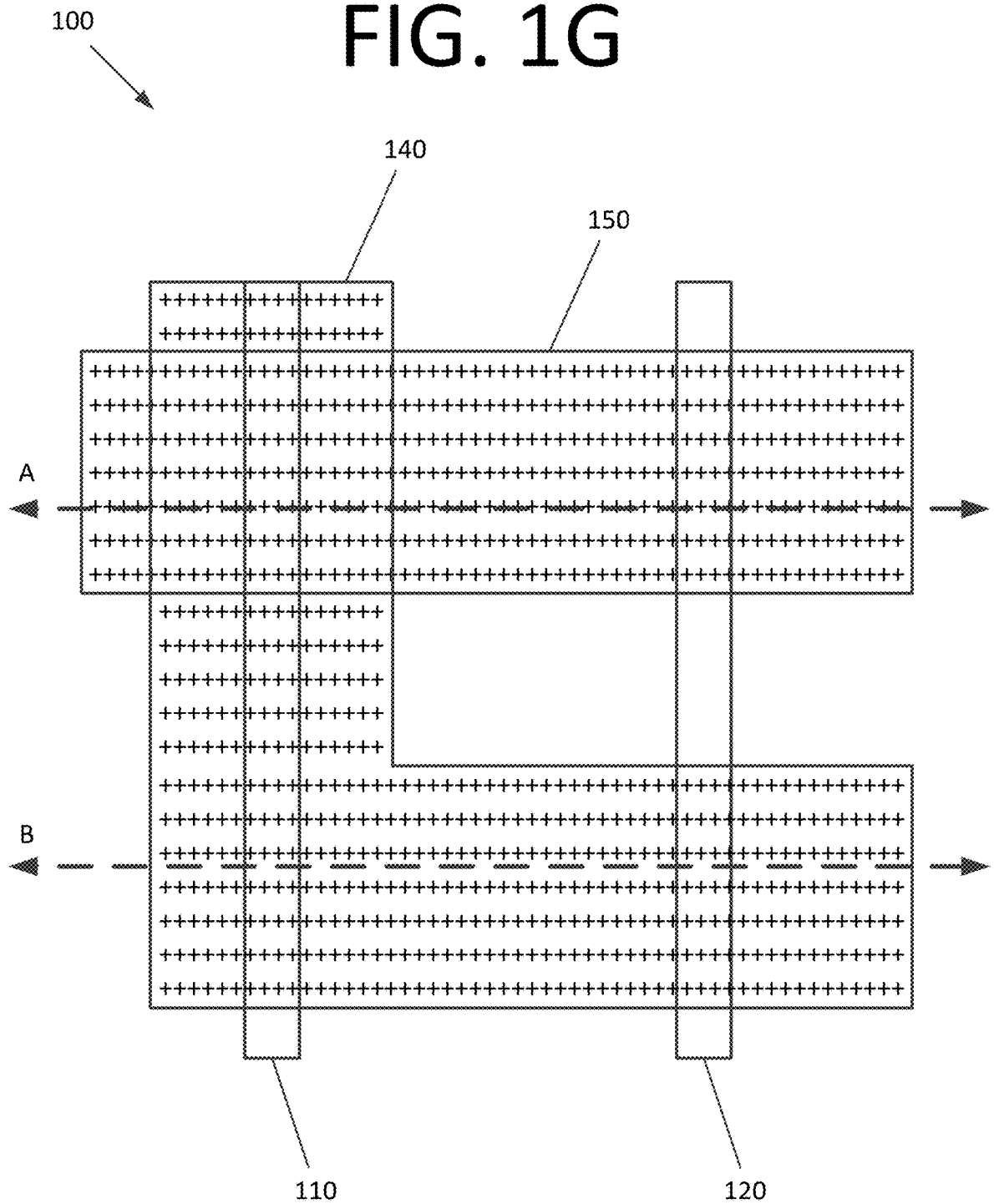
Figure 1H:
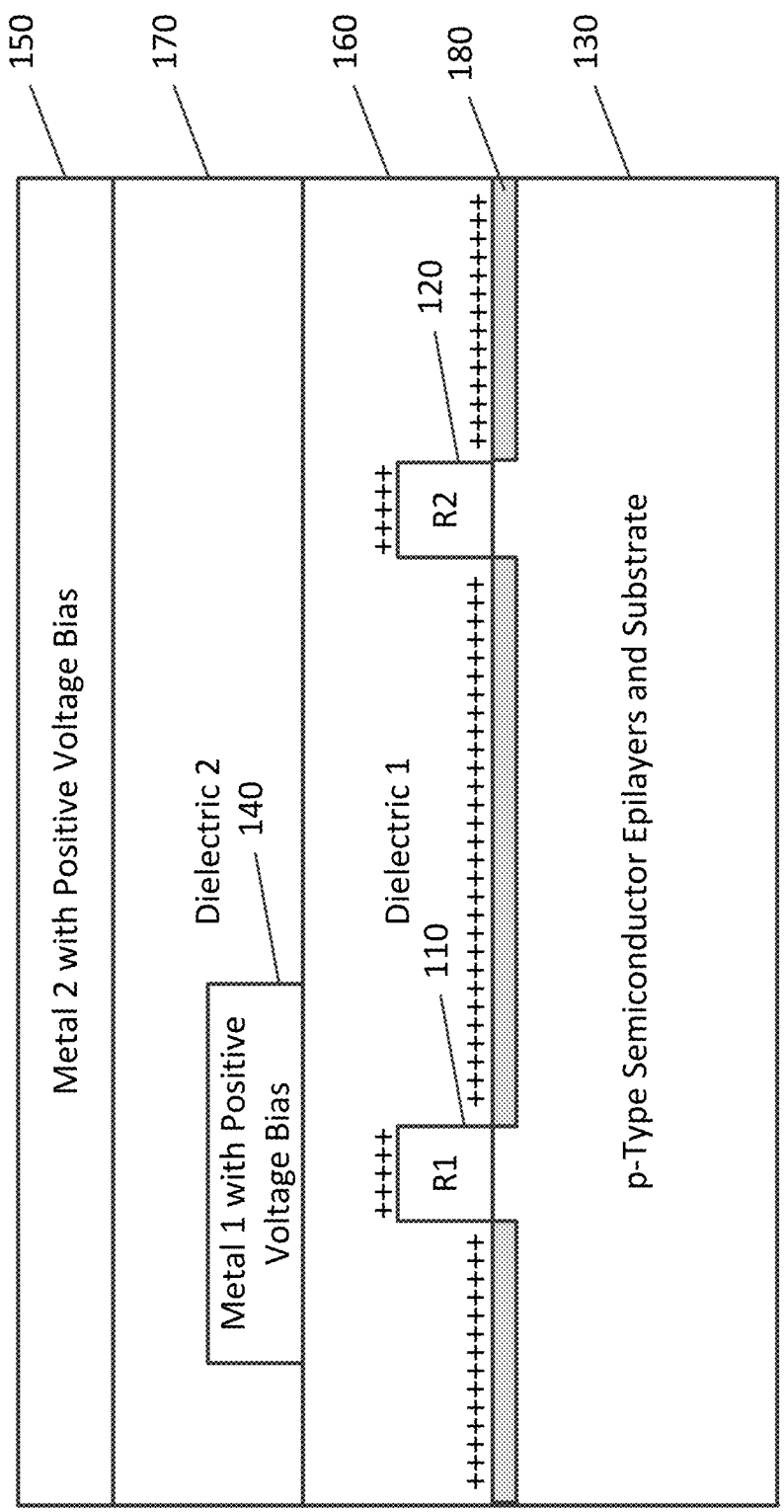
FIGS. 1H-J show two side cross-section views and a top view of the pair of laterally separated semiconductor electronic devices with positive mobile ion contaminants from FIGS. 1C and 1D, respectively, but with a positive voltage bias applied to metals 1 and 2 after sufficient time duration at higher temperature such that the mobile positive ions have moved away from the positively biased metals.
Figure 1I:
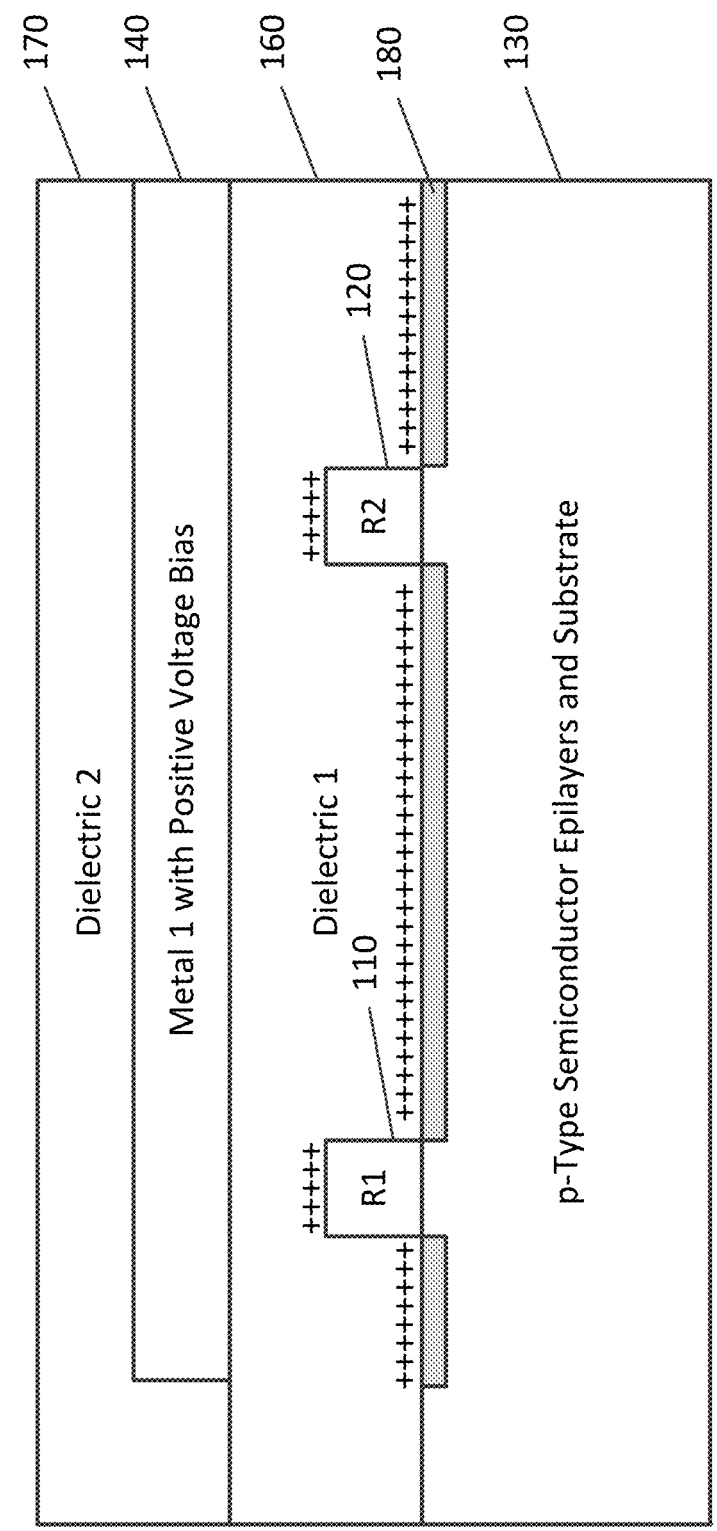
Figure 1J:
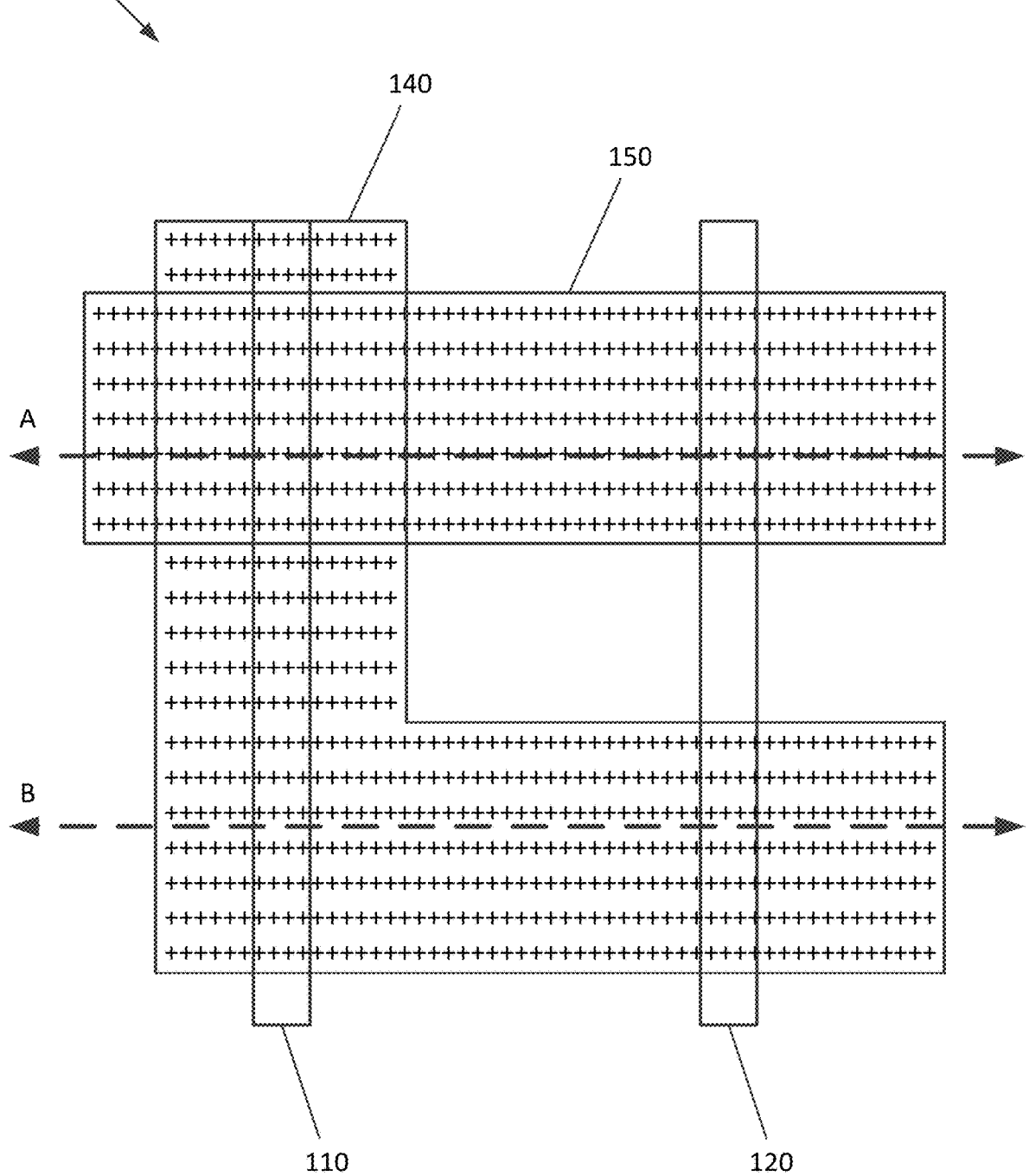
Figure 2A:
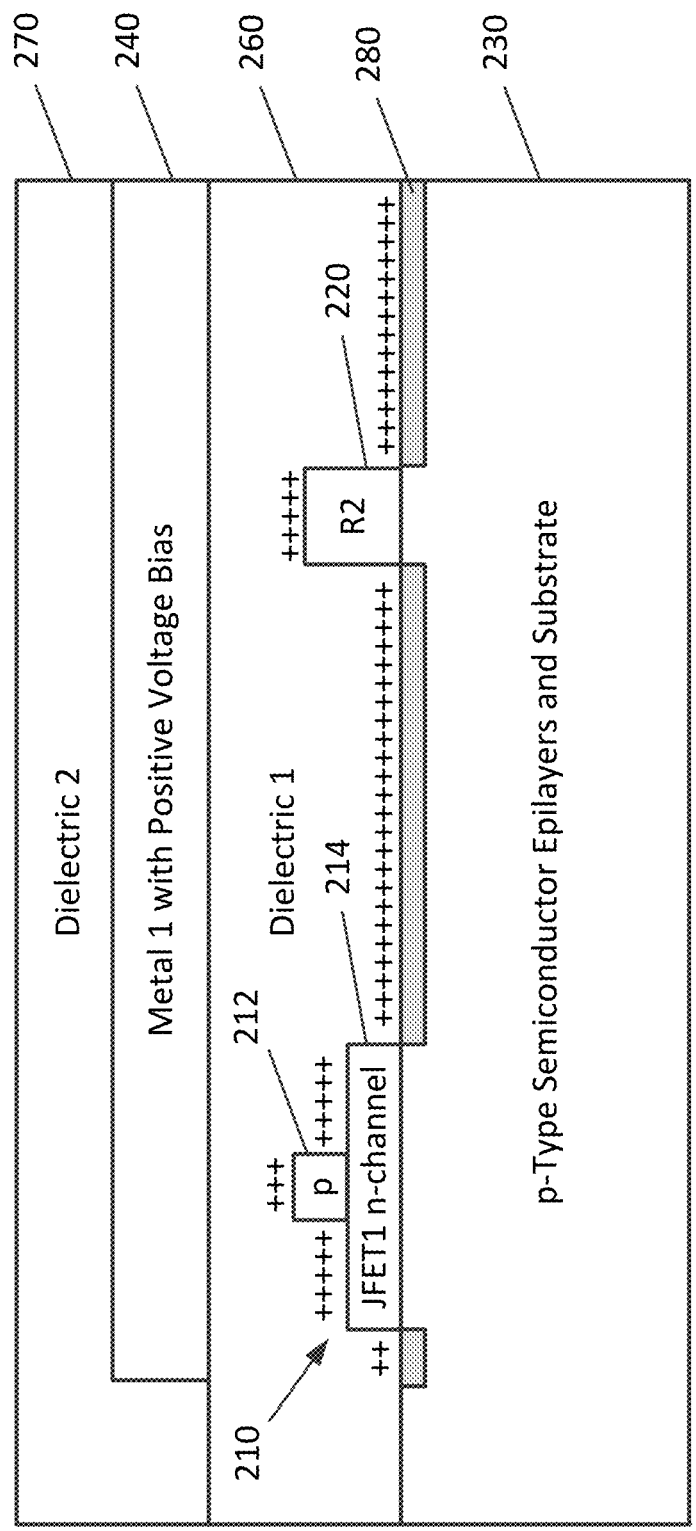
FIG. 2A is a side cross-section view illustrating a pair of laterally separated semiconductor electronic devices (one JFET and one resistor of mesa-etched construction) in an IC.
Figure 2B:
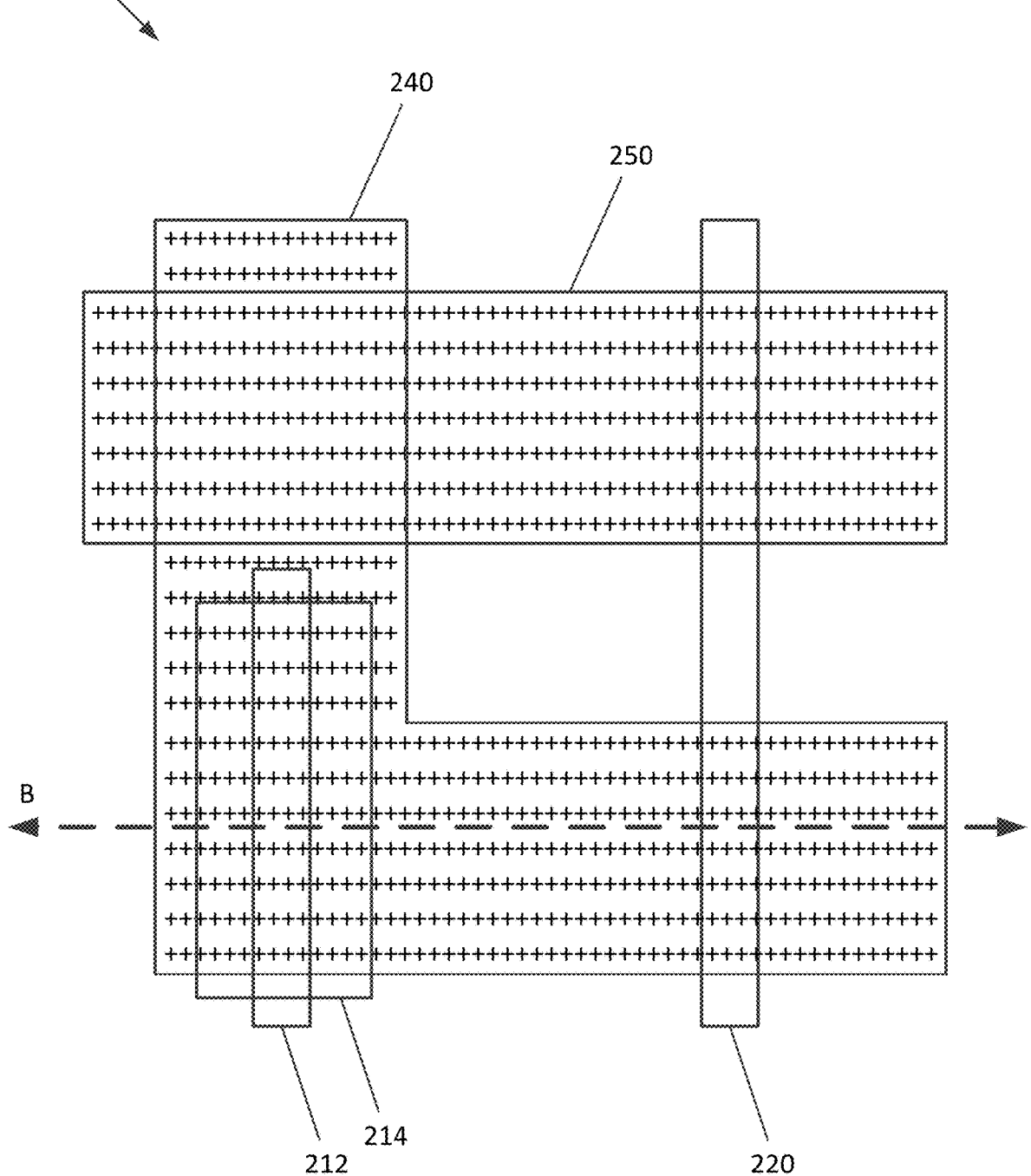
FIG. 2B is a top view illustrating the pair of laterally separated semiconductor electronic devices of FIG. 2A with the dielectric layers and p-type semiconductor omitted for clarity.
Figure 3A:
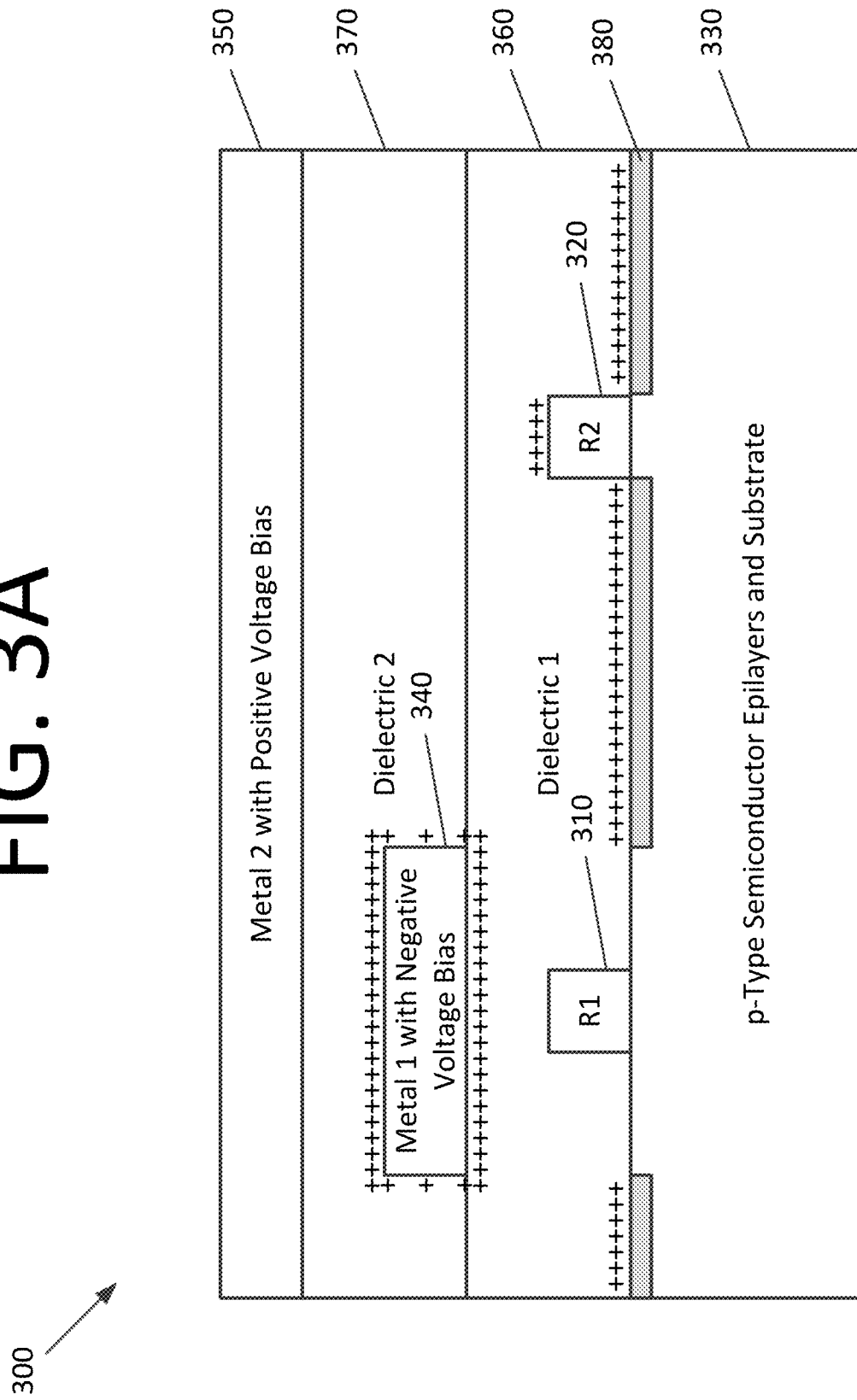
FIG. 3A is a side cross-section view illustrating a pair of laterally separated semiconductor electronic devices (resistors of mesa-etched construction) on a SiC JFET-R IC with resistors in a Mesa configuration, according to an embodiment of the present invention.
Figure 3B:
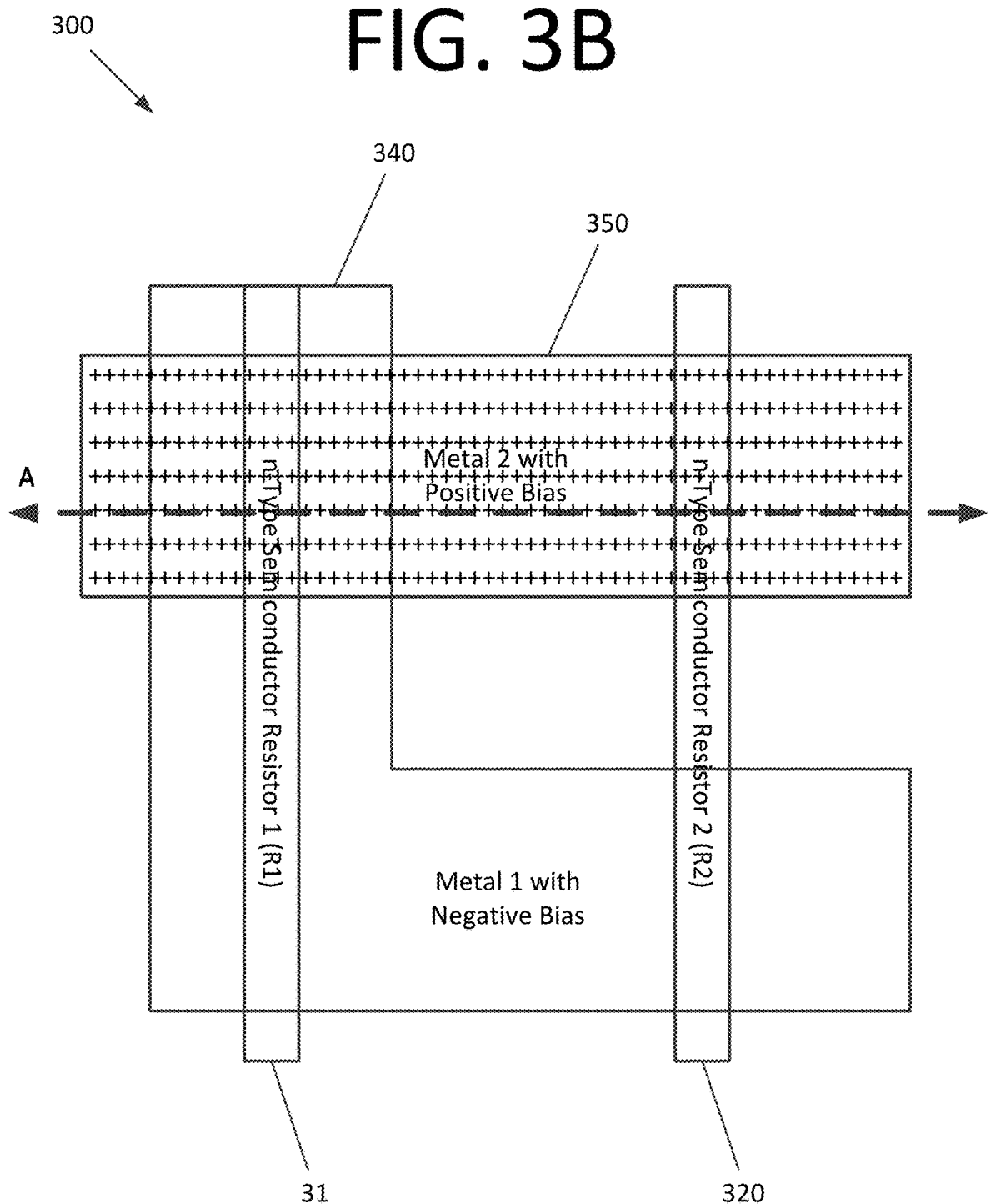
FIG. 3B is a top view illustrating the pair of laterally separated semiconductor electronic devices of FIG. 3A with the dielectric layers and p-type top semiconductor surface layer omitted for clarity, according to an embodiment of the present invention.

FIGS. 3A and 3B are a side cross-section view and a top view, respectively, showing a small sub-region of a SiC JFET-R IC 300 with resistors formed in a Mesa configuration, according to an embodiment of the present invention. However, some embodiments may be practiced in other IC technologies where: (1) the IC technology has two levels of metal interconnection insulated from each other and the devices by first and second dielectric layers; and (2) n-type device layers are laterally separated and residing on p-type top substrate layers. For example, beyond the n-channel resistor and n-channel JFET transistor IC technologies described herein, some embodiments may be employed in n-channel Metal-Semiconductor Field Effect Transistor (MESFET) ICs, Heterojunction Field Effect Transistor (HFET) ICs, Bipolar Junction Transistor (BJT) ICs, etc. as device topologies/classifications that can feature laterally separated n-layer features residing on p-type top substrate layers.

As with FIGS. 1A-J, IC 300 includes resistors R1 310 and R2 320, a semiconductor p-type top substrate layer 330, metal layers 340, 350, and dielectric layers 360, 370. However, in this embodiment, a negative bias voltage is applied to metal layer 340. Alternatively, in some embodiments, negatively biased metal layer 340 may be located above R2 320 instead of R1 310, between R1 310 and R2 320, or a combination thereof, so long as the location of negatively biased metal layer 340 prevents a "short circuit" between R1 310 and R2 320 due to positive ion contamination.

Metal layers 340, 350 may include any metal of sufficient electrical conductivity and physical durability to function as conductors in the IC operating for intended duration in the intended application environment in some embodiments. Towards these ends, each conductive metal layer 340, 350 may include multiple layers of different metal alloys. For NASA GRC SiC JFET-R ICs experimentally proven to durably function at 500° C., metal layers 340, 350 of $TaSi_2$ deposited using close-proximity direct current (DC) sputtering have been used. However, other materials, such as tungsten, TiW, $TaSi_3$, and molybdenum, may be used. Also, other deposition methods, such as radio frequency (RF) sputtering, chemical vapor deposition (CVD), thermal electron beam evaporation, etc. may be employed depending upon physical and electrical properties of various combinations/alternatives meeting IC application requirements.

Dielectric layers 360, 370 may include any dielectric of sufficient electrical insulation and physical durability to function in the IC operating for intended duration in the intended application environment. Towards these ends, each insulating dielectric layer 360, 370 may include multiple layers of different dielectric materials. For NASA GRC SiC JFET-R ICs experimentally proven to durably function at 500° C., dielectric layers 360, 370 were made from $SiO_2$ or an $SiO_2/Si_3N_4/SiO_2$ multi-layer stack deposited using Low Pressure Chemical Vapor Deposition (LPCVD). However, other suitable insulating materials (e.g., $Al_2O_3$, AlN, etc.) and other deposition methods (e.g., plasma-assisted CVD, thermal oxidation, etc.) may be used depending upon physical and electrical properties of various combinations/alternatives meeting IC application requirements.

Safe routing of the positive voltage in metal layer 350 with a trace spanning both R1 310 and R2 320 (more clearly seen in FIG. 3A, but also visible in FIG. 3B) is accomplished without undesired electrical connection of R1 310 with R2 320 by an inversion conduction layer, such as inversion conduction layer 380. As can be clearly seen in FIG. 3A, inversion conduction layer 380 does not form under negatively biased metal layer 340. The negative bias applied to metal layer (trace) 340, cross-sectional position of negatively biased metal layer 340 between R1 310 and metal layer 350, the lateral extension of metal layer 340 (left-right) beyond the lateral extent of R1 310 all combine to attract the positive mobile ion contaminant charges (+ symbols) during higher-temperature IC operation so as to suppress formation of an undesired conducting inversion electron channel entirely traversing between R1 310 and R2 320. In FIGS. 3A and 3B, R1 310 and R2 320 remain electrically isolated/ unconnected despite the positively biased trace of metal layer 350 traversing R1 310 and R2 320. This is due to the fact that the positive ion contaminants (e.g., salt ions) are pulled away from the SiC surface of substrate 330 beneath the trace of metal layer 340 by the negative bias on metal layer 340. This occurs at high temperature as well, and the effect is more pronounced. It should be noted that inversion layers 380 are still formed in some regions, as depicted in some regions of FIG. 3A, where the mobile ions are repelled by the positive bias on metal trace 350 to migrate down close enough to the interface between semiconductor 330 and first dielectric layer 360, where the high positive charge density results in inversion channel formation, as is known.

However, inversion layers 380 do not laterally extend beneath negatively biased metal 1 trace 340 so as to provide a complete circuit conduction path between R1 310 and R2 320, and thus, R1 310 and R2 320 remain electrically isolated from each other as required for IC 300 to successfully operate. Simply put, a partial, interfering short circuit does not occur between R1 310 and R2 320 in FIG. 3A. The negative bias and laterally extended position selected for metal 1 340 succeeds in preventing the formation of an interfering short circuit, despite the inversion-channel promoting positive bias of metal 2 350 laterally spanning/bridging the gap between R1 310 and R2 320. It should be noted that embodiments may be applied to any non-MOS-FET transistor IC technology that has a p-type top layer substrate in contact with at least two laterally separated regions of n-type semiconductor that serve as at least two separated devices (as is the case with two resistors) or foundational layers of at least two separated devices (as is the case with two JFETs), two distinct levels of interconnects, a negative power supply, and a positive power supply.

Figure 4A:
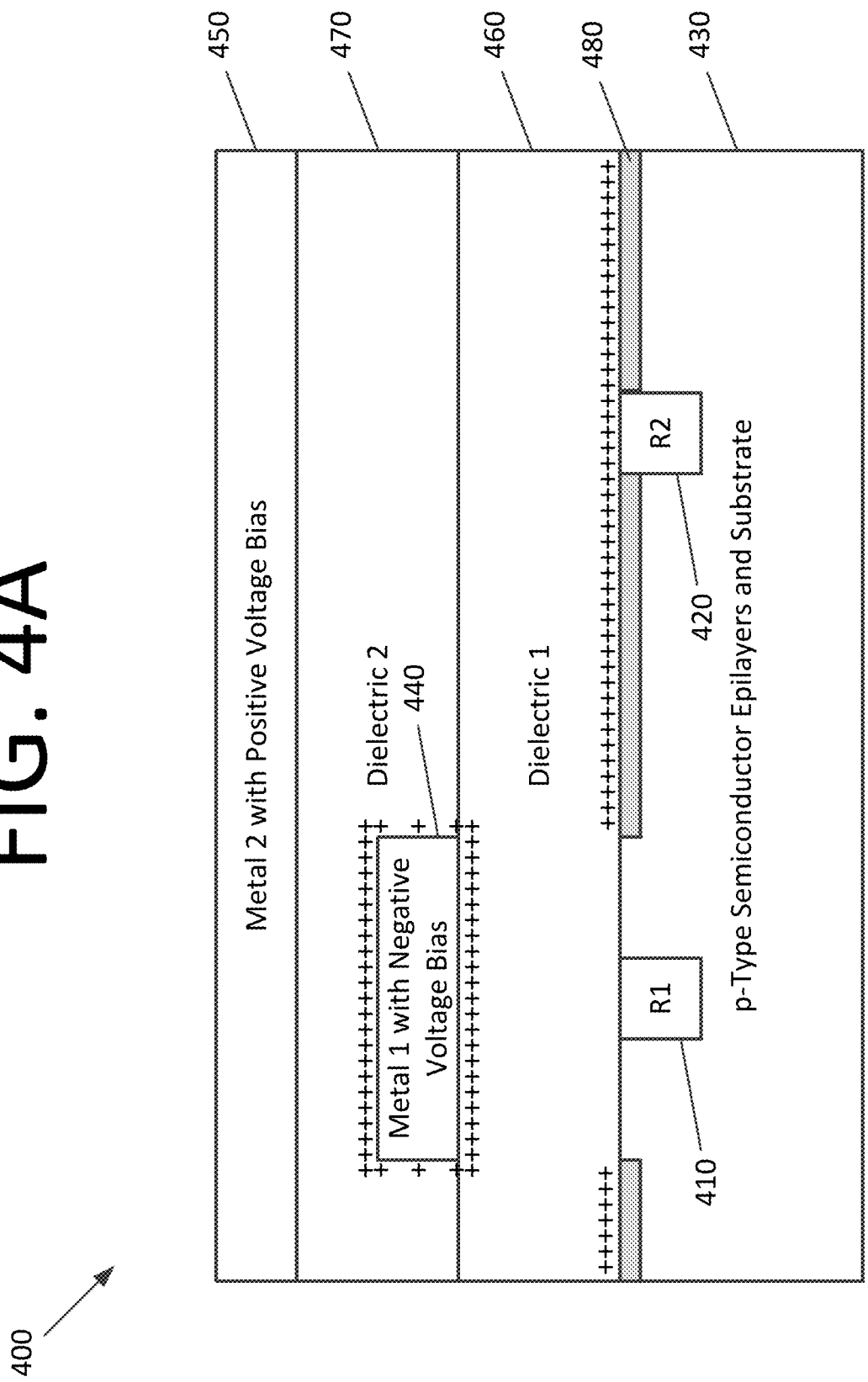
FIG. 4A is a side cross-section view illustrating pair of laterally separated semiconductor electronic devices (resistors of either ion-implanted construction or dopant diffusion construction) on a SIC JFET-R IC, according to an embodiment of the present invention.

FIGS. 4A and 4B show an IC 400 that includes resistors R1 410 and R2 420, a semiconductor substrate 430, metal layers 440, 450, dielectric layers 460, 470, and inversion conduction layers 480. However, in this embodiment, R1 410 and R2 420 are located in substrate 430 rather than protruding as mesas, as shown in FIGS. 3A and 3B. In other words, some embodiments have planar device topologies. In some embodiments, planar device topologies can be formed by known laterally patterned ion implantation doping and diffusion doping techniques. As is the case in IC 300 of FIGS. 3A and 3B, inversion conduction layers 480 do not form in the vicinity of R1 410.

Figure 5A:
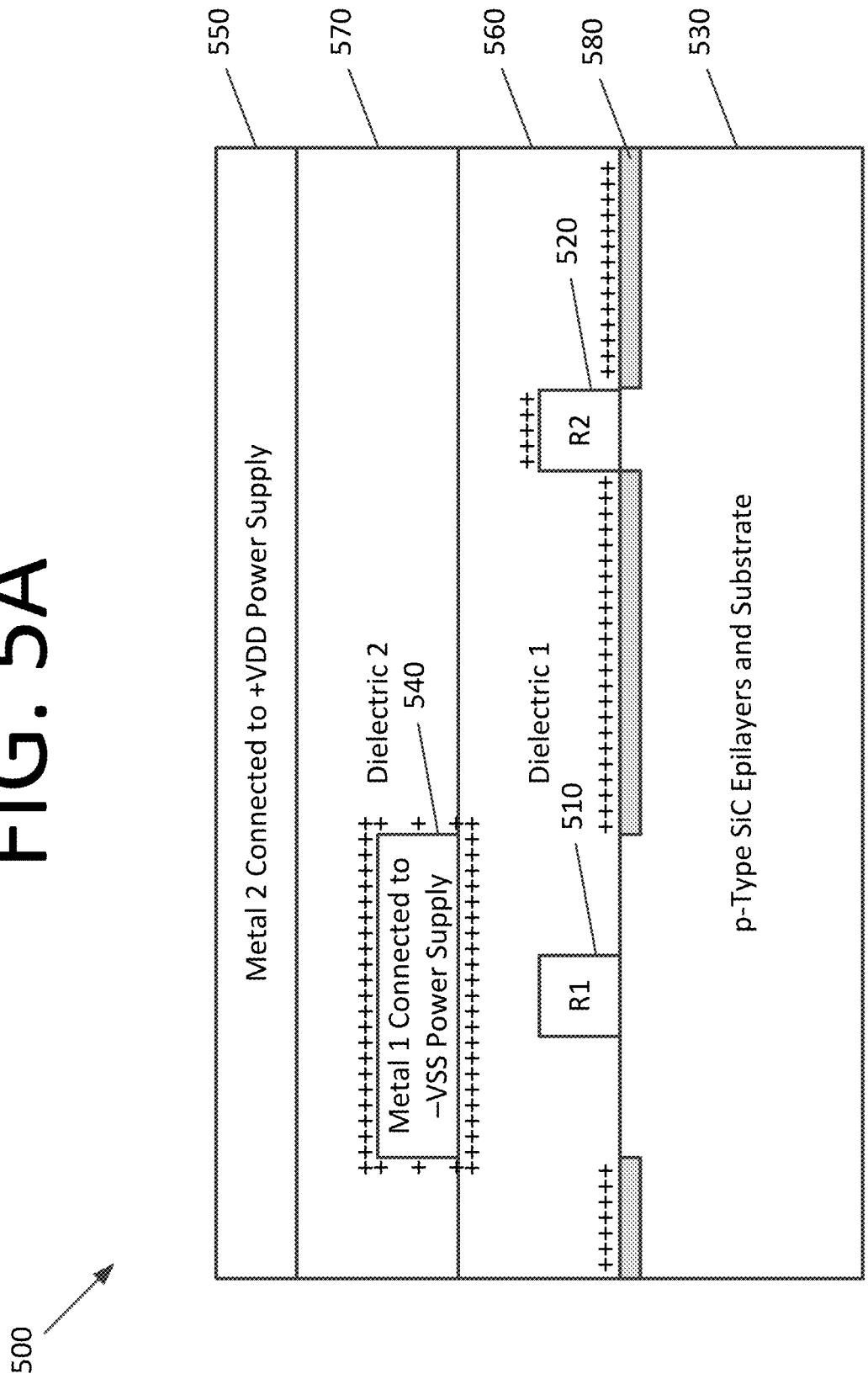
FIG. 5A is a side cross-section view illustrating a pair of laterally separated semiconductor electronic devices (resistors of mesa-etched construction) on a SiC JFET-R IC and the first and second metals connected to a negative power supply (−VSS) bias voltage and a positive (+VDD) bias voltage of the IC, respectively, according to an embodiment of the present invention.
Figure 5B:
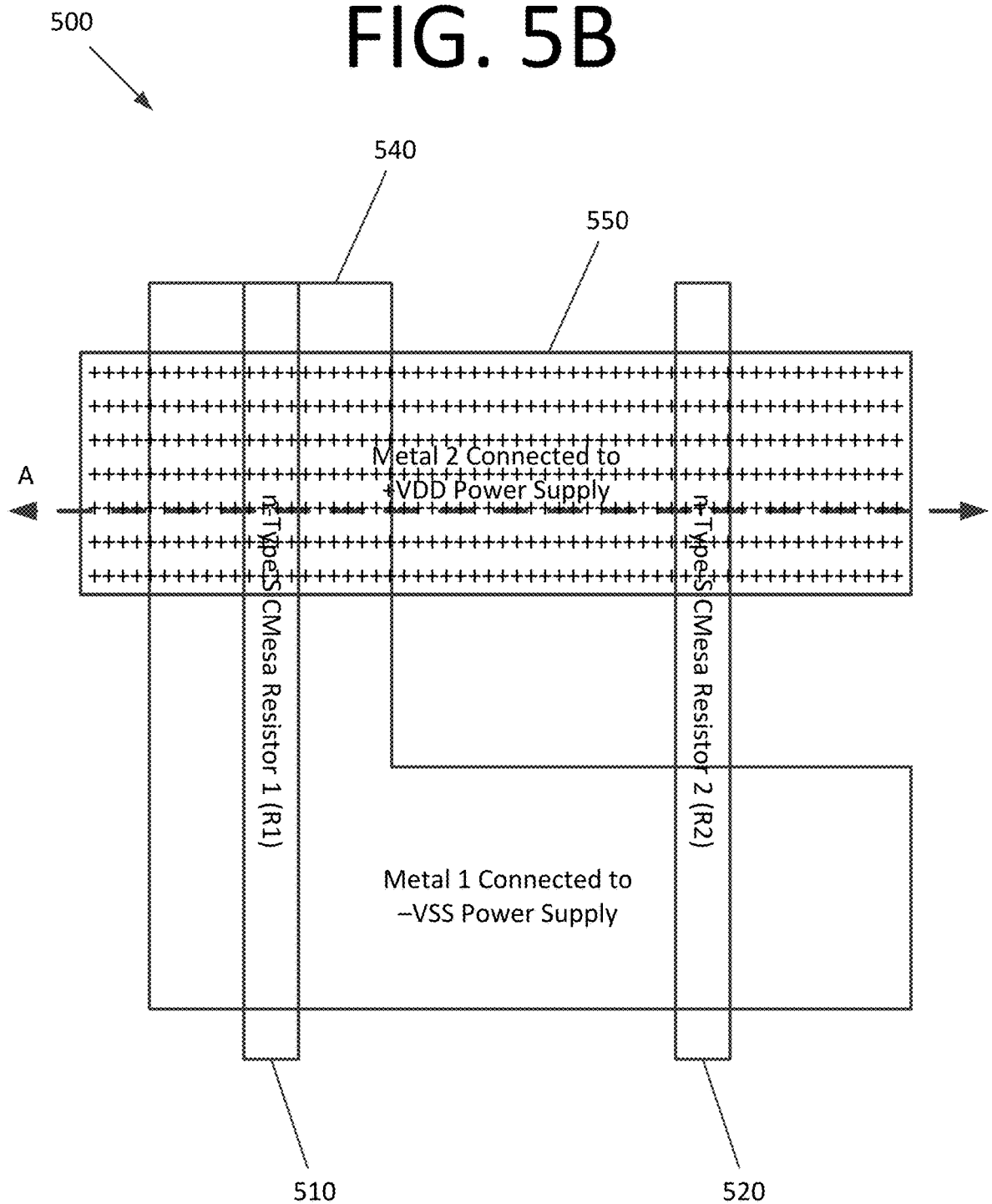
FIG. 5B is a top view illustrating the pair of laterally separated semiconductor electronic devices of FIG. 5A with the dielectric layers and p-type semiconductor omitted for clarity, according to an embodiment of the present invention.

Some embodiments apply the principles discussed above to ICs fabricated on a SiC semiconductor with standard power supply voltages needed/available/routed throughout an entire chip. The subsection of such an IC 500 is shown in FIGS. 5A and 5B. As is common in the art, the positive power supply voltage is referred to +VDD and the negative power supply voltage is referred to as −VSS. In some embodiments, for example, the +VDD power supply voltage is in the range of +10V to +30V while the −VSS power supply voltage is in the range of −10V to −30V. However, any suitable voltage magnitudes may be used without deviating from the scope of the invention.

The architecture of IC 500 is similar to that of IC 300 of FIGS. 3A and 3B, including resistors R1 510 and R2 520, a semiconductor substrate 530, metal layers 540, 550, and dielectric layers 560, 570. Mobile ion charge redistribution and behavior and location of inversion conduction layers 580 are also indicated similar to that of FIGS. 3A and 3B. However, in this embodiment, metal layer 540 is connected to the −VSS power supply and metal layer 550 is connected to the +VDD power supply.

Figure 6:
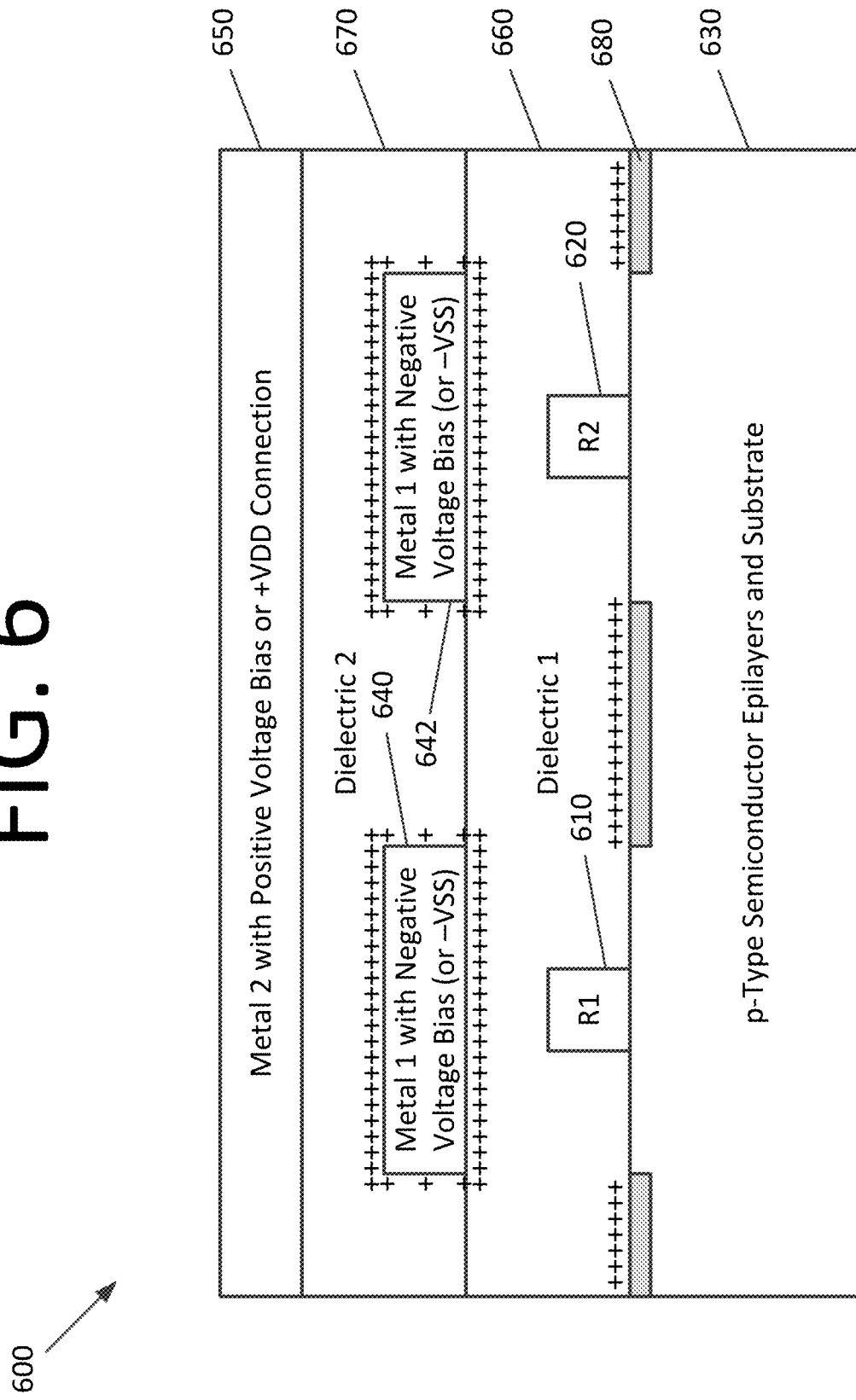
FIG. 6 is a side cross-section view illustrating a pair of laterally separated semiconductor electronic devices (resistors of mesa-etched construction) on a SiC JFET-R IC with two metal layers having a negative voltage bias or connection to −VSS located above each resistor, according to an embodiment of the present invention.
Figure 7:
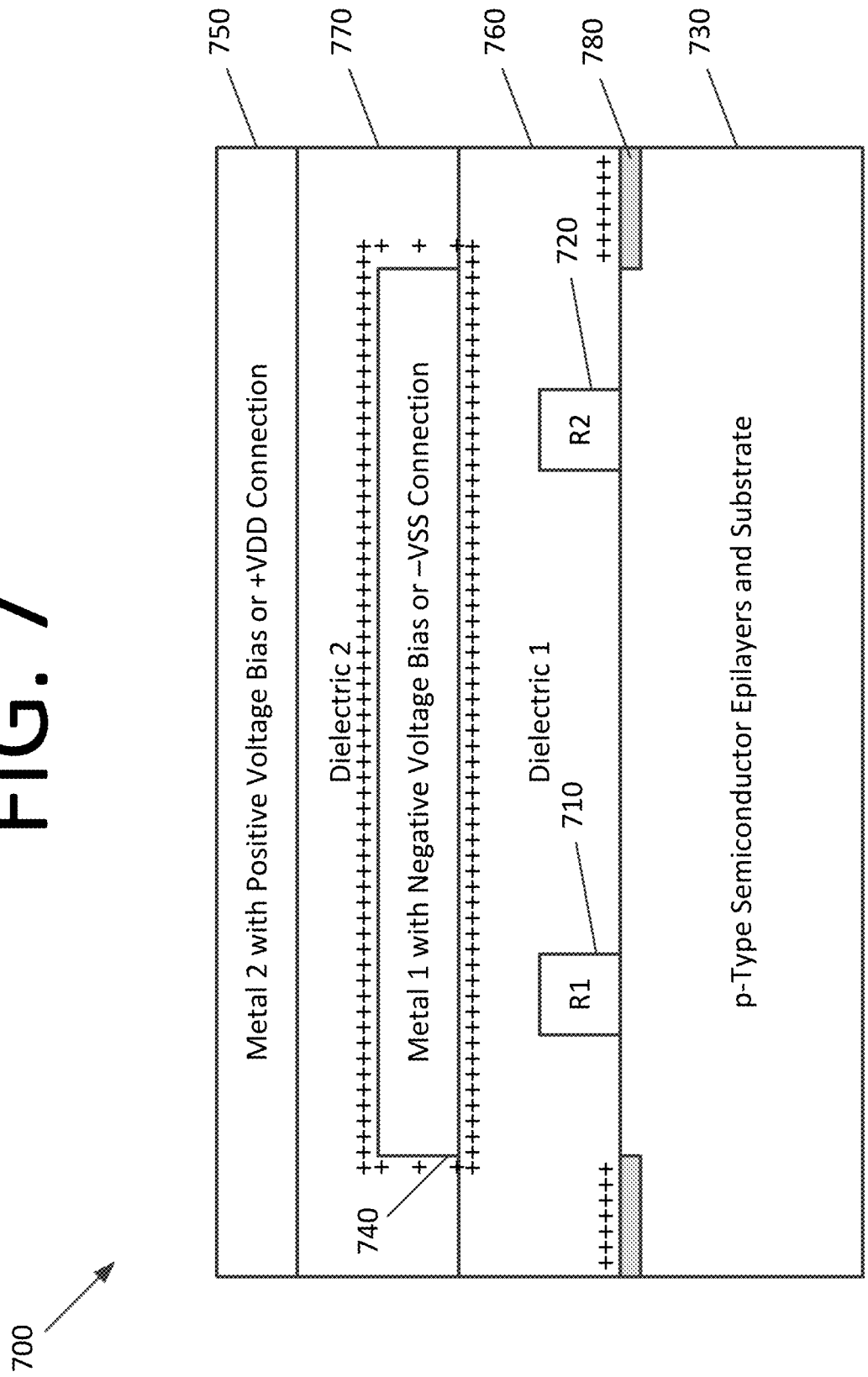
FIG. 7 is a side cross-section view illustrating a pair of laterally separated semiconductor electronic devices (resistors of mesa-etched construction) on a SiC JFET-R IC with a single metal layer having a negative voltage bias or connection to −VSS located above both resistors, according to an embodiment of the present invention.

Other architectures are possible without deviating from the scope of the invention. For instance, IC 600 of FIG. 6 includes resistors R1 610 and R2 620, a semiconductor substrate 630, a positively biased or +VDD-connected metal layer 650, dielectric layers 660, 670, and inversion conduction layers 680. However, in this embodiment, two metal layers 640, 642 having a negative voltage bias or connection to −VSS are located over R1 610 and R2 620, respectively. IC 700 of FIG. 7 includes resistors R1 710 and R2 720, a semiconductor substrate 730, a positively biased or +VDD-connected metal layer 750, dielectric layers 760, 770, and inversion conduction layers 780. However, metal layer 740 having a negative voltage bias or connection to −VSS spans and is located above both R1 710 and R2 720. Naturally, the general architectures of ICs 600, 700 of FIGS. 6 and 7, respectively, may have a planar topology rather than a Mesa topology, with the resistors located in the substrate rather than in a dielectric layer. Simply put, the embodiments shown in FIGS. 3A to 7 keep positively charged mobile ions away from at least one of the resistors.

Figure 8A:
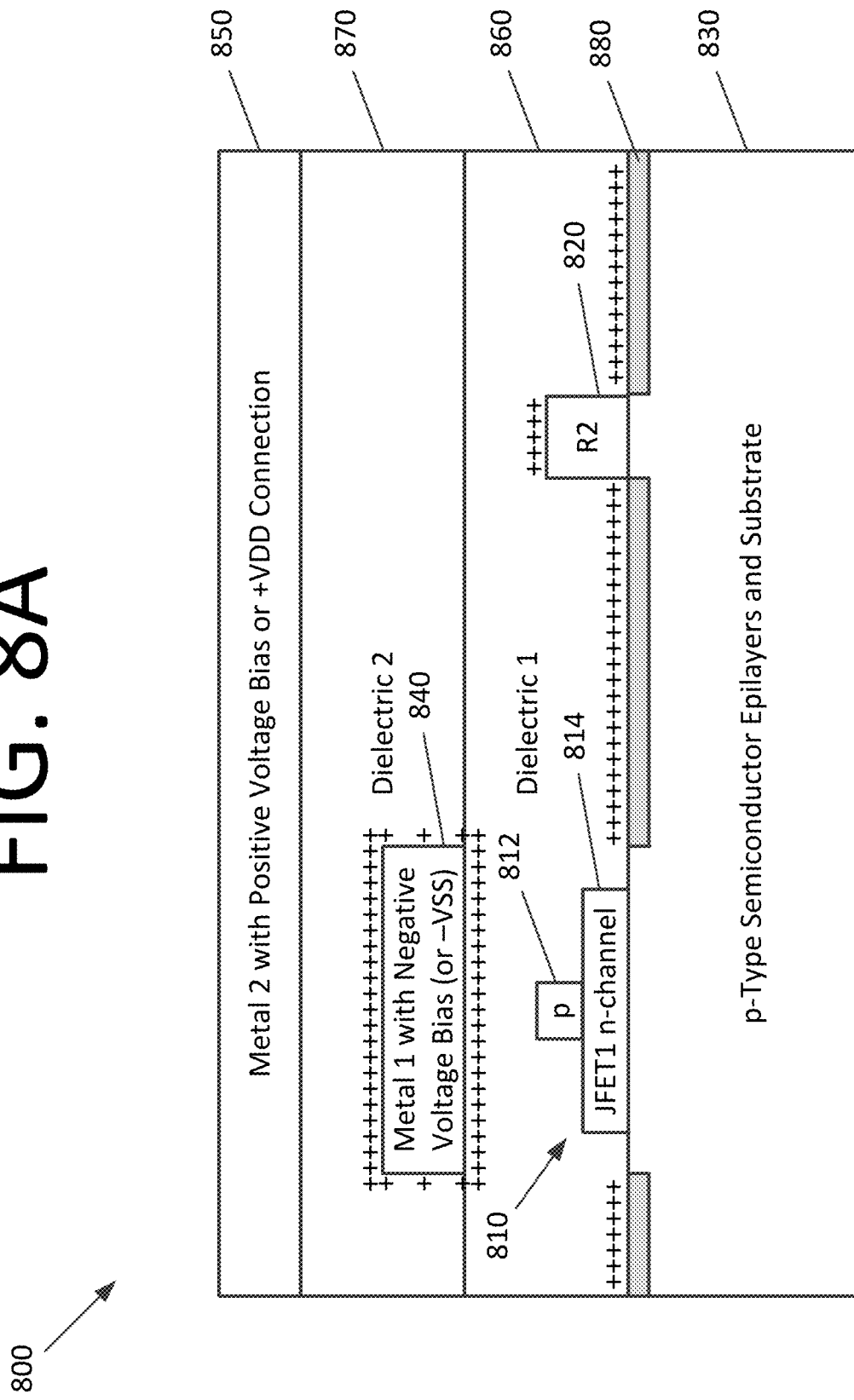
FIG. 8A is a side cross-section view illustrating a pair of laterally separated semiconductor electronic devices (one JFET and one resistor of mesa-etched construction) in an IC, according to an embodiment of the present invention.
Figure 8B:
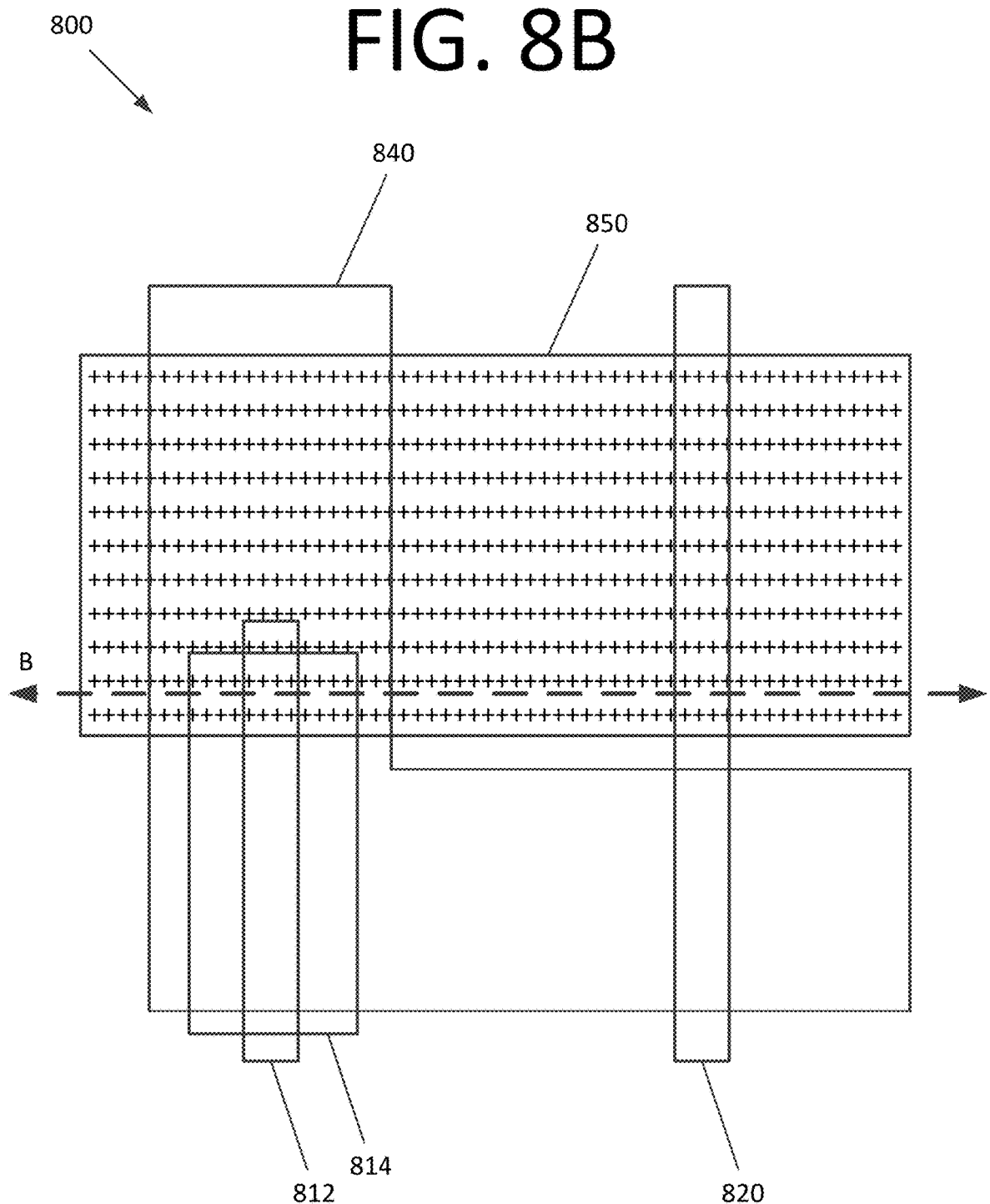
FIG. 8B is a top view illustrating the pair of laterally separated semiconductor electronic devices of FIG. 8A with the dielectric layers and p-type semiconductor omitted for clarity, according to an embodiment of the present invention.

As disclosed above, in addition to n-channel resistors, the approach of some embodiments may be applied to other components. For instance, FIGS. 8A and 8B show a small sub-region of an IC 800 with a similar architecture to those shown previously, with a resistor R2 820, a semiconductor substrate 830, metal layers 840, 850, and dielectric layers 860, 870. However, in this embodiment, JFET1 810 is the other component to be shielded from positive ion contamination. JFET1 810 includes a p-mesa gate 812 and an n-mesa channel 814. Negatively biased metal layer 840 shields JFET1 810 from positive ion contamination, preventing a "short circuit" between JFET1 810 and R2 820. In some embodiments, a second JFET may take the place of R2 820.

Figure 9:
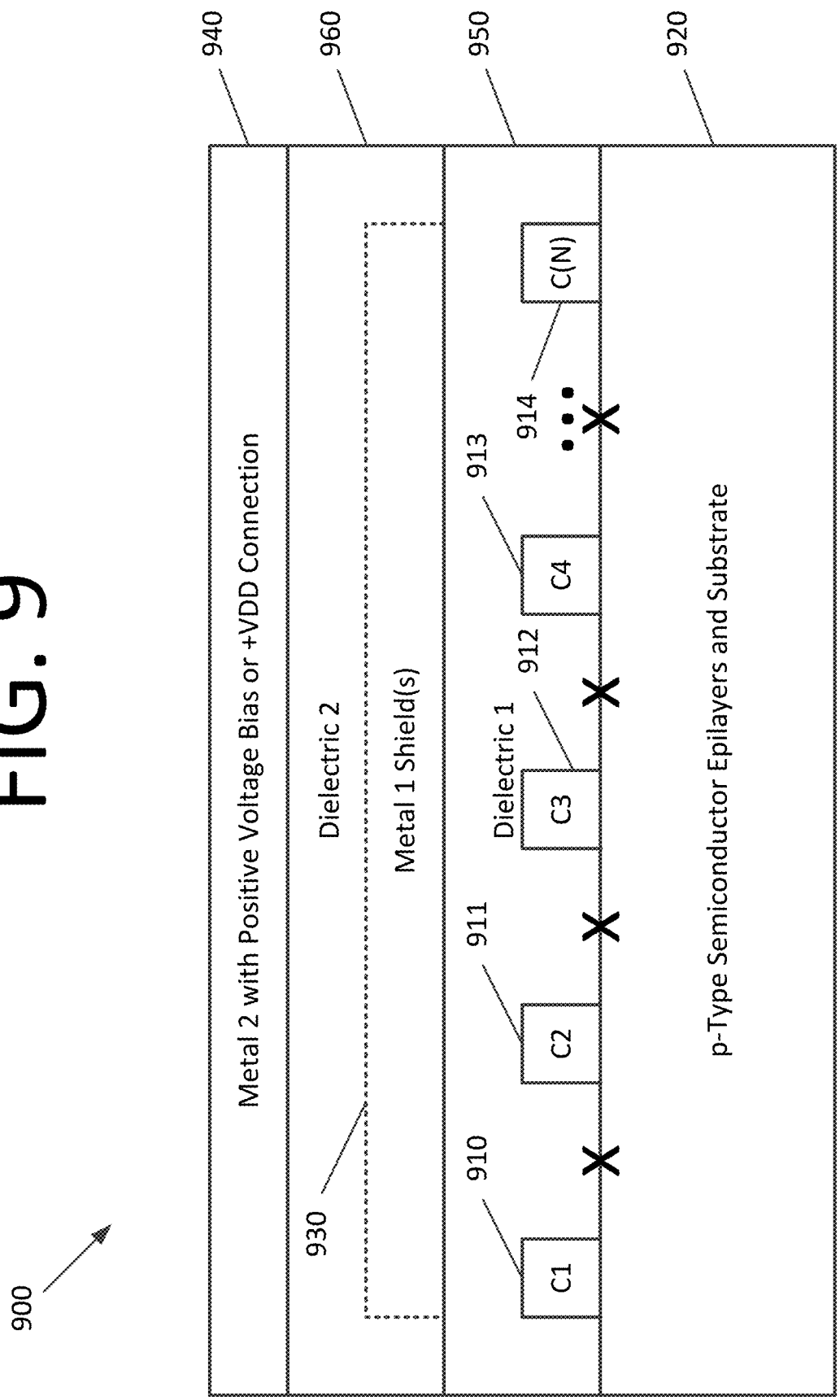
FIG. 9 is a side cross-section view illustrating laterally separated semiconductor electronic devices of mesa-etched construction in a dielectric layer of an IC, according to an embodiment of the present invention.
Figure 10:
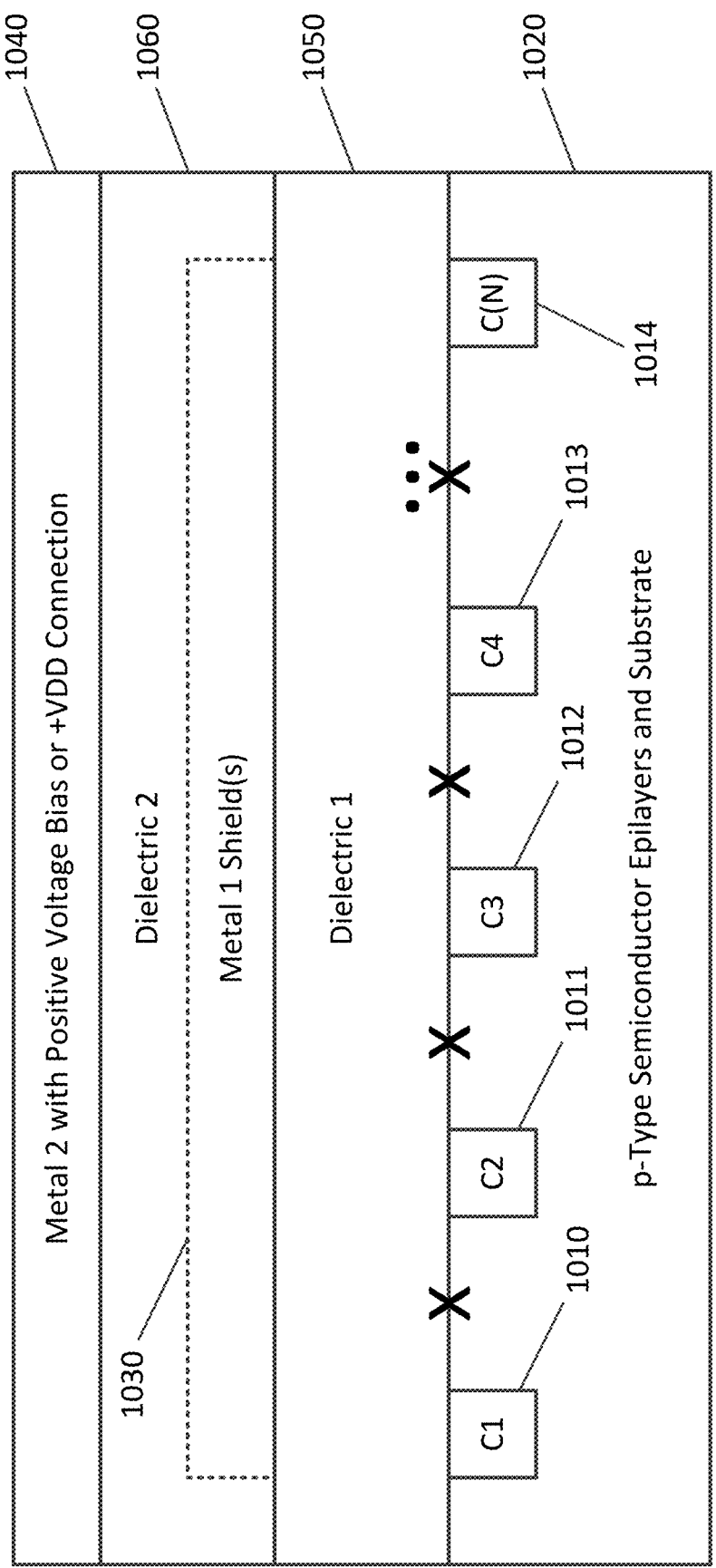
FIG. 10 is a side cross-section view illustrating laterally separated semiconductor electronic devices of either ion-implanted construction or dopant diffusion construction in a p-type semiconductor substrate of an IC, according to an embodiment of the present invention.

It should be noted that some embodiments are not limited to ICs with a single pair of components alone. Indeed, any number of components may be used so long as the negative effects of positive ion contamination are prevented between adjacent pairs of components. For instance, FIGS. 9 and 10 show small sub-regions of ICs 900, 1000 that include a semiconductor substrate 920, metal layer 940, and dielectric layers 950, 960. Components C1 910, C2 911, C3 912, C4 913, . . . , C(N) 914 are located in dielectric layer 950 in FIG. 9 and components C1 1010, C2 1011, C3 1012, C4 1013, . . . , C(N) 1014 are located in semiconductor substrate 1020 in FIG. 10. Metal shield(s) 930, 1030 attract positive ion contamination and protect the underlying components. Metal shield(s) 930, 1030 are negatively biased and may be a single metal layer or multiple metal layers, so long as the metal layer(s) protect the pairs of components from shorts.

It should be noted that the cross-section views shown in FIGS. 1A, 1C, 1E, 1H, 2A, 3A, and 4A are at the locations of dashed cutline A in FIGS. 1B, 1D, 1G, 1J, 2B, 3B, and 4B, respectively. The cross-section views shown in FIGS. 1F, 1I, 7A, 8A, and 9A are at the locations of dashed cutline B in FIGS. 1G, 1J, 7B, 8B, and 9B, respectively.

Figure 11:
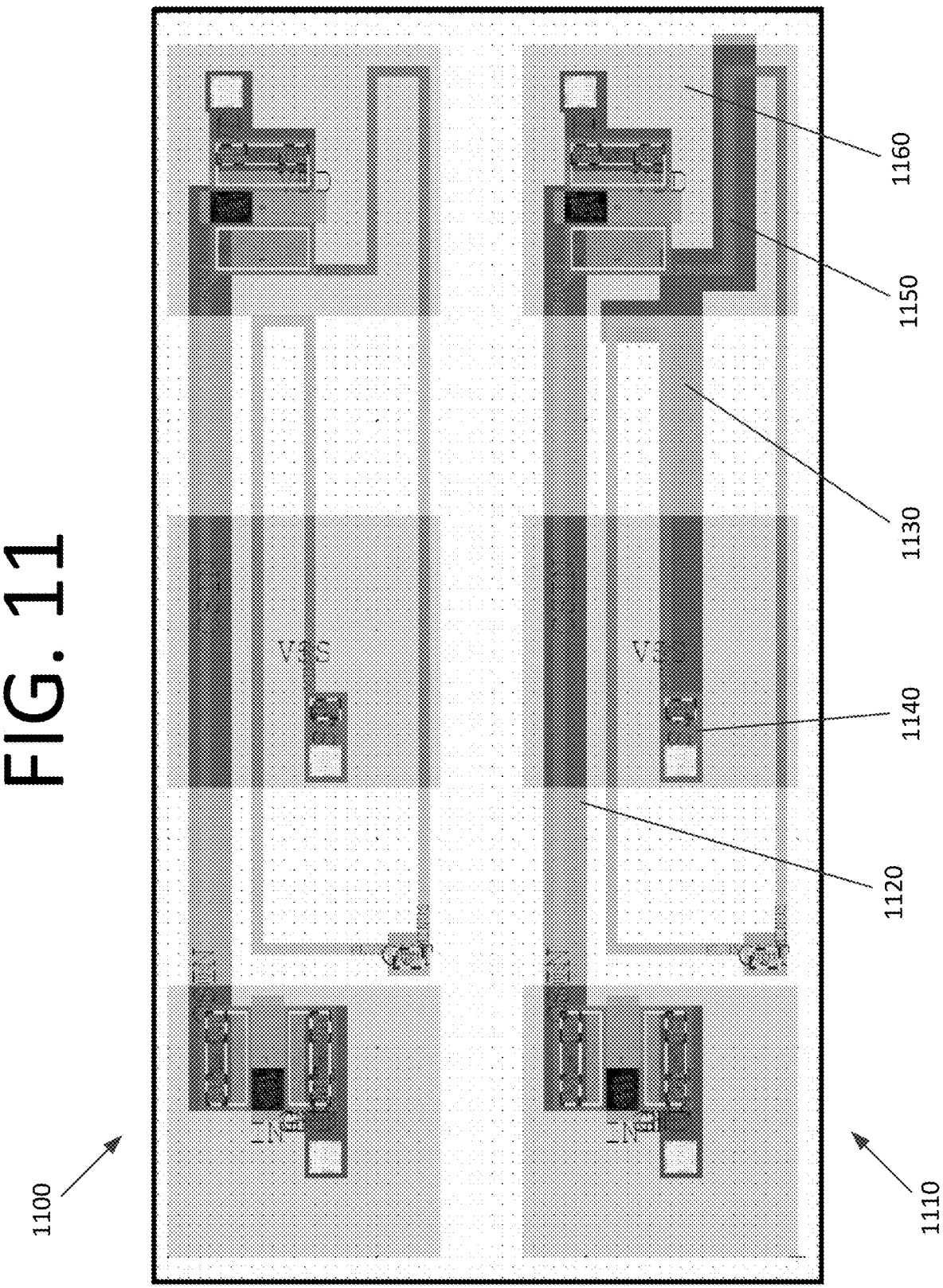
FIG. 11 is a mask layout computer-aided design (CAD) drawing illustrating a comparison of a conventional IC architecture (top) versus an architecture that mitigates detrimental mobile ion contamination effects (bottom), according to an embodiment of the present invention.

FIG. 11 is a mask layout computer-aided design (CAD) drawing illustrating a comparison of a conventional IC architecture 1100 versus an architecture that mitigates detrimental mobile ion contamination effects 1110, according to an embodiment of the present invention. Architectures 1100, 1110 are SiC JFET-R "NOT" logic gate designs that are mostly identical, both containing identical resistor and JFET lateral device layout geometry, device values (e.g., resistances in ohms), and electrical circuit interconnections. This, only elements of architecture 1110 are labeled to reduce clutter. However, in addition to a first metal layer (i.e., metal layer 1) interconnect trace 1120, and unlike in architecture 1100, architecture 1110 includes an additional (second) trace of first metal layer (i.e., metal layer 1) interconnect 1130 that runs from a −VSS bias interconnect via 1140 to cover regions of one of the SiC resistors 1150 where the +VDD metal 1160 (indicated by a gray square in the CAD, in the metal 2 layer) crosses overhead of resistor 1150. The problem is largest at/near +VDD. The presence of additional first metal layer interconnect trace 1130 tied to the −VSS power supply bias prevents an inversion conduction channel forming under +VDD metal 2 layer trace 1160 beneath regions covered by negatively biased first metal layer trace 1130. Thus, there is no parasitic inversion channel conduction electrically connecting any of the resistors and transistors to the other resistors and transistors.

It will be readily understood that the elements of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An integrated circuit, comprising:
a pair of laterally separated semiconductor components with lateral extent dimensions comprising at least one semiconductor region of n-type conductivity polarity located in physical contact with a p-type top semiconductor surface layer of a substrate;
a first dielectric layer located on top of the p-type top semiconductor surface layer, the first dielectric layer configured to provide electrical insulation from subsequent layers of the integrated circuit located above the first dielectric layer; and
a first metal layer located on top of at least a portion of the first dielectric layer, the first metal layer configured to have a negative voltage bias and at least some lateral extent dimensions overlapping and exceeding lateral extent dimensions of at least one of the pair of laterally separated semiconductor components, wherein
the first metal layer is positioned to break a parasitic conduction circuit formed by positive ion contamination between the pair of laterally separated semiconductor components.

2. The integrated circuit of claim 1, further comprising:
a second dielectric layer located on top of the first dielectric layer and the first metal layer, the second dielectric layer providing electrical insulation from subsequent layers of the integrated circuit located above the second dielectric layer; and
a second metal layer located on top of at least a portion of the second dielectric layer, the second metal layer configured to have a positive voltage bias and at least some lateral extent dimensions overlapping and bridging the lateral extent dimensions of the pair of laterally separated semiconductor electronic components.

3. The integrated circuit of claim 2, wherein the first metal layer and the second metal layer are positioned such that the negative voltage bias applied to the first metal layer, a cross-sectional position of the first metal layer between a semiconductor component of the pair of semiconductor components and the positively biased second metal layer, and the lateral extent dimensions of the first metal layer overlapping and exceeding the lateral extent dimensions of at least one of the pair of laterally separated semiconductor components combine to attract positive mobile ion contaminant charges during operation of the integrated circuit and suppress formation of a conducting inversion electron channel entirely traversing between a first semiconductor component and a second semiconductor component of the pair of semiconductor components.

4. The integrated circuit of claim 1, wherein the pair of laterally separated semiconductor electronic components are laterally adjacent to the first dielectric layer.

5. The integrated circuit of claim 1, wherein the pair of laterally separated semiconductor electronic components are laterally adjacent to the substrate.

6. The integrated circuit of claim 1, wherein one or both of the pair of laterally separated semiconductor components are an n-channel resistor, a Junction Field Effect Transistor (JFET), an n-channel Metal-Semiconductor Field Effect Transistor (MESFET), an n-channel Heterojunction Field Effect Transistor (HFET), an n-channel Bipolar Junction Transistor (BJT), or a combination thereof.

7. The integrated circuit of claim 1, wherein the integrated circuit is configured to operate at a temperature of 400° C. or more.

8. The integrated circuit of claim 1, further comprising:
an additional semiconductor component laterally separated from one of the pair of laterally separated semiconductor components, wherein
the first metal layer is also positioned to break a parasitic conduction circuit formed by positive ion contamination between the additional semiconductor component and the one of the pair of laterally separated semiconductor components.

9. A semiconductor integrated circuit, comprising:
a substrate comprising a top semiconductor surface layer of p-type conductivity polarity;
a pair of laterally separated semiconductor components with lateral extent dimensions comprising at least one semiconductor region of n-type conductivity polarity located in physical contact with the p-type top semiconductor surface layer of the substrate;
a first dielectric layer located on top of the p-type top semiconductor surface layer, the first dielectric layer configured to provide electrical insulation from subsequent layers of the semiconductor integrated circuit located above the first dielectric layer;
a first metal layer located on top of at least a portion of the first dielectric layer, the first metal layer configured to have a negative voltage bias and at least some lateral extent dimensions overlapping and exceeding lateral extent dimensions of at least one of the pair of laterally separated semiconductor components;
a second dielectric layer located on top of the first dielectric layer and the first metal layer, the second dielectric layer providing electrical insulation from subsequent layers of the semiconductor integrated circuit located above the second dielectric layer; and
a second metal layer located on top of at least a portion of the second dielectric layer, the second metal layer configured to have a positive voltage bias and at least some lateral extent dimensions overlapping and bridging the lateral extent dimensions of the pair of laterally separated semiconductor electronic components.

10. The semiconductor integrated circuit of claim 9, wherein the pair of laterally separated semiconductor electronic components are laterally adjacent to the first dielectric layer.

11. The semiconductor integrated circuit of claim 9, wherein the pair of laterally separated semiconductor electronic components are laterally adjacent to the substrate.

12. The semiconductor integrated circuit of claim 9, wherein the first metal layer and the second metal layer are positioned such that the negative bias applied to the first metal layer, a cross-sectional position of the first metal layer between a semiconductor component of the pair of semiconductor components and the positively biased second metal layer, and the lateral extent dimensions of the first metal layer overlapping and exceeding the lateral extent dimensions of at least one of the pair of laterally separated semiconductor components combine to attract positive mobile ion contaminant charges during operation of the integrated circuit and suppress formation of a conducting inversion electron channel entirely traversing between the first semiconductor component and the second semiconductor component.

13. The semiconductor integrated circuit of claim 9, wherein one or both of the pair of laterally separated semiconductor components are an n-channel resistor, a Junction Field Effect Transistor (JFET), an n-channel Metal-Semiconductor Field Effect Transistor (MESFET), an n-channel Heterojunction Field Effect Transistor (HFET), an n-channel Bipolar Junction Transistor (BJT), or a combination thereof.

14. The semiconductor integrated circuit of claim 9, wherein the integrated circuit is configured to operate at a temperature of 400° C. or more.

15. The semiconductor integrated circuit of claim 9, further comprising:
an additional semiconductor component laterally separated from one of the pair of laterally separated semiconductor components, wherein
the first metal layer is also positioned to break a parasitic conduction circuit formed by positive ion contamination between the additional semiconductor component and the one of the pair of laterally separated semiconductor components.

16. A multilayer integrated circuit, comprising:
a first insulated semiconductor component and a second insulated semiconductor component having lateral extent dimensions comprising at least one semiconductor region of n-type conductivity polarity; and
a first metal layer configured to have a negative voltage bias and at least some lateral extent dimensions overlapping and exceeding lateral extent dimensions of the first insulated semiconductor component, the second insulated semiconductor component, or both, wherein
the first insulated semiconductor component and the second insulated semiconductor component are laterally separated from one another,
the first metal layer is located above the first insulated semiconductor component and the second insulated semiconductor component, but not physically connected to the first insulated semiconductor component and the second insulated semiconductor component, and
the first metal layer is positioned to break a parasitic conduction circuit formed by positive ion contamination between the first insulated semiconductor component and the second insulated semiconductor component.

17. The multilayer integrated circuit of claim 16, wherein the first metal layer is located above a dielectric layer that provides insulation to the first insulated semiconductor component and the second insulated semiconductor component.

18. The multilayer integrated circuit of claim 16, wherein first insulated semiconductor component and the second insulated semiconductor component are laterally adjacent to a dielectric layer or a substrate.

19. The multilayer integrated circuit of claim 16, further comprising:
a substrate comprising a top semiconductor surface layer of p-type conductivity polarity, wherein
the first insulated semiconductor component and the second insulated semiconductor component are located in physical contact with the p-type top semiconductor surface layer of the substrate.

20. The multilayer integrated circuit of claim 16, further comprising:
a dielectric layer located on top of the first metal layer, the second dielectric layer configured to provide electrical insulation from subsequent layers of the multilayer integrated circuit located above the dielectric layer; and
a second metal layer located on top of at least a portion of the dielectric layer, the second metal layer configured to have a positive voltage bias and at least some lateral extent dimensions overlapping and bridging the lateral extent dimensions of the first insulated semiconductor component, the second insulated semiconductor component, or both.

\* \* \* \* \*